(12) United States Patent
Rokhsaz

(10) Patent No.: US 11,736,959 B2
(45) Date of Patent: *Aug. 22, 2023

(54) RADIO FREQUENCY (RF) FIELD STRENGTH DETECTING CIRCUIT

(71) Applicant: RFMicron, Inc., Austin, TX (US)

(72) Inventor: Shahriar Rokhsaz, Austin, TX (US)

(73) Assignee: RFMicron, Inc., Austin, TX (US)

( * ) Notice: Subject to any disclaimer, the term of this patent is extended or adjusted under 35 U.S.C. 154(b) by 106 days.

This patent is subject to a terminal disclaimer.

(21) Appl. No.: 17/364,555

(22) Filed: Jun. 30, 2021

(65) Prior Publication Data

US 2021/0352497 A1 Nov. 11, 2021

Related U.S. Application Data

(60) Continuation of application No. 16/846,951, filed on Apr. 13, 2020, now Pat. No. 11,064,373, which is a
(Continued)

(51) Int. Cl.
*H03J 3/20* (2006.01)
*H04W 24/02* (2009.01)
(Continued)

(52) U.S. Cl.
CPC ........ *H04W 24/02* (2013.01); *G06K 7/10198* (2013.01); *G06K 7/10316* (2013.01);
(Continued)

(58) Field of Classification Search
CPC .... H04B 17/11; H04B 5/0081; H04B 5/0075; H04B 5/0093; H04B 5/0062;
(Continued)

(56) References Cited

U.S. PATENT DOCUMENTS 4,724,427 A 2/1988 Carroll
5,073,781 A 12/1991 Stickelbrocks
(Continued)

FOREIGN PATENT DOCUMENTS

AU 626692 B2 8/1992
DE 10151856 A1 5/2003
(Continued)

OTHER PUBLICATIONS

Belk; An etched antenna for autoclaveable RFID tags; 1996 Symposium on Antenna Technology and Applied Electromagnetics; Montreal, QC, Canada; 1996; pp. 183-186.
(Continued)

*Primary Examiner* — Cindy Trandai
(74) *Attorney, Agent, or Firm* — Garlick & Markison; Patricia M. Healy

(57) ABSTRACT

A radio frequency (RF) circuit includes a tank circuit having a selectively variable impedance. The RF circuit further includes a tuning circuit adapted to dynamically vary the impedance of the tank circuit, and to develop a first quantized value representative of a change to impedance of the tank circuit. The RF circuit further includes a detector circuit adapted to develop a second quantized value representative of a field strength of a received RF signal.

10 Claims, 13 Drawing Sheets

Related U.S. Application Data continuation of application No. 16/183,578, filed on Nov. 7, 2018, now Pat. No. 10,623,970, which is a continuation of application No. 15/272,907, filed on Sep. 22, 2016, now Pat. No. 10,149,177, which is a continuation-in-part of application No. 14/256,877, filed on Apr. 18, 2014, now Pat. No. 9,785,807, which is a continuation-in-part of application No. 13/467,925, filed on May 9, 2012, now Pat. No. 10,224,902, and a continuation-in-part of application No. 13/209,420, filed on Aug. 14, 2011, now Pat. No. 8,749,319, and a continuation-in-part of application No. 13/209,425, filed on Aug. 14, 2011, now Pat. No. 9,048,819, said application No. 13/467,925 is a continuation-in-part of application No. 13/209,425, filed on Aug. 14, 2011, now Pat. No. 9,048,819, said application No. 13/209,420 is a continuation-in-part of application No. 12/462,331, filed on Aug. 1, 2009, now Pat. No. 8,081,043, said application No. 13/209,425 is a continuation-in-part of application No. 12/462,331, filed on Aug. 1, 2009, now Pat. No. 8,081,043, which is a division of application No. 11/601,085, filed on Nov. 18, 2006, now Pat. No. 7,586,385.

(60) Provisional application No. 62/221,907, filed on Sep. 22, 2015, provisional application No. 61/934,935, filed on Feb. 3, 2014, provisional application No. 61/929,017, filed on Jan. 18, 2014, provisional application No. 61/896,102, filed on Oct. 27, 2013, provisional application No. 61/875,599, filed on Sep. 9, 2013, provisional application No. 61/871,167, filed on Aug. 28, 2013, provisional application No. 61/833,265, filed on Jun. 10, 2013, provisional application No. 61/833,167, filed on Jun. 10, 2013, provisional application No. 61/833,150, filed on Jun. 10, 2013, provisional application No. 61/814,241, filed on Apr. 20, 2013, provisional application No. 61/485,732, filed on May 13, 2011, provisional application No. 61/428,170, filed on Dec. 29, 2010.

(51) Int. Cl.
| | |
|---|---|
| *H04W 52/02* | (2009.01) |
| *H04B 1/40* | (2015.01) |
| *G06K 19/07* | (2006.01) |
| *G06K 7/10* | (2006.01) |
| *H04W 84/18* | (2009.01) |
| *H04W 76/14* | (2018.01) |

(52) U.S. Cl.
CPC ..... *G06K 7/10346* (2013.01); *G06K 7/10366* (2013.01); *G06K 19/0717* (2013.01); *G06K 19/0723* (2013.01); *H03J 3/20* (2013.01); *H04B 1/40* (2013.01); *H04W 52/0261* (2013.01); *H03J 2200/10* (2013.01); *H04W 76/14* (2018.02); *H04W 84/18* (2013.01); *Y02D 30/70* (2020.08)

(58) Field of Classification Search
CPC ......... H04B 5/0012; H04B 5/00; H04B 1/40; H03J 2200/10; H03J 3/20; H03J 7/285; H04W 24/02; H04W 52/0261; H04W 76/14; H04W 84/18; G06K 7/10198; G06K 7/10316; G06K 7/10346; G06K 7/10366; G06K 19/0717; G06K 19/0723; Y02D 30/70
See application file for complete search history.

(56) References Cited

U.S. PATENT DOCUMENTS

| | | |
|---|---|---|
| 5,103,222 A | 4/1992 | Hogen Esch et al. |
| 5,301,358 A | 4/1994 | Gaskill et al. |
| 5,345,231 A | 9/1994 | Koo |
| 5,491,715 A | 2/1996 | Flaxl |
| 5,680,064 A | 10/1997 | Masaki et al. |
| 5,856,809 A | 1/1999 | Schoepfer |
| 5,872,476 A | 2/1999 | Mihara et al. |
| 5,953,642 A | 9/1999 | Feldtkeller et al. |
| 5,959,899 A | 9/1999 | Sredanovic |
| 5,969,542 A | 10/1999 | Maley et al. |
| 6,002,290 A | 12/1999 | Avery et al. |
| 6,060,991 A | 5/2000 | Hsieh |
| 6,133,777 A | 10/2000 | Savelli |
| 6,140,924 A | 10/2000 | Chia et al. |
| 6,400,206 B2 | 6/2002 | Kim et al. |
| 6,433,582 B2 | 8/2002 | Hirano |
| 6,477,062 B1 | 11/2002 | Wagner et al. |
| 6,477,092 B2 | 11/2002 | Takano |
| 6,529,127 B2 | 4/2003 | Townsend et al. |
| 6,650,227 B1 | 11/2003 | Bradin |
| 6,671,494 B1 * | 12/2003 | James ............ H04B 1/385 455/66.1 |
| 6,703,920 B2 | 3/2004 | Zimmer |
| 6,747,548 B1 * | 6/2004 | Yamaguchi ........ G06K 19/0701 340/572.1 |
| 6,838,924 B1 | 1/2005 | Davies, Jr. |
| 6,838,951 B1 | 1/2005 | Nieri et al. |
| 6,856,173 B1 | 2/2005 | Chun |
| 6,862,432 B1 | 3/2005 | Kim |
| 6,870,461 B2 | 3/2005 | Fischer et al. |
| 6,888,459 B2 | 5/2005 | Stilp |
| 6,889,905 B2 | 5/2005 | Shigemasa et al. |
| 6,940,467 B2 | 9/2005 | Fischer et al. |
| 6,963,226 B2 | 11/2005 | Chiang |
| 7,023,817 B2 | 4/2006 | Kuffner et al. |
| 7,071,730 B2 | 7/2006 | Cordoba |
| 7,079,034 B2 | 7/2006 | Stilp |
| 7,088,246 B2 | 8/2006 | Fukuoka |
| 7,123,057 B2 | 10/2006 | Wang et al. |
| 7,132,946 B2 | 11/2006 | Waldner et al. |
| 7,167,090 B1 | 1/2007 | Mandal et al. |
| 7,215,043 B2 | 5/2007 | Tsai et al. |
| 7,317,378 B2 | 1/2008 | Jarvis et al. |
| 7,347,379 B2 | 3/2008 | Ward et al. |
| 7,423,472 B2 | 9/2008 | Hirose et al. |
| 7,439,860 B2 | 10/2008 | Andresky |
| 7,443,199 B2 | 10/2008 | da Fonte Dias et al. |
| 7,449,917 B2 | 11/2008 | Cheon |
| 7,479,886 B2 | 1/2009 | Burr |
| 7,528,725 B2 | 5/2009 | Stewart |
| 7,535,362 B2 | 5/2009 | Moser et al. |
| 7,551,058 B1 | 6/2009 | Johnson et al. |
| 7,583,179 B2 | 9/2009 | Wu et al. |
| 7,583,942 B2 | 9/2009 | Ihara |
| 7,592,961 B2 | 9/2009 | Thober et al. |
| 7,609,090 B2 | 10/2009 | Srivastava et al. |
| 7,629,880 B2 | 12/2009 | Stilp et al. |
| 7,768,308 B2 | 8/2010 | Maede et al. |
| 7,775,083 B2 | 8/2010 | Potyrailo et al. |
| 7,826,297 B2 | 11/2010 | Takeda et al. |
| 7,880,594 B2 | 2/2011 | Breed et al. |
| 7,948,810 B1 | 5/2011 | Tang et al. |
| 7,984,091 B1 * | 7/2011 | Szedo ............ G06F 1/035 708/271 |
| 8,120,984 B2 | 2/2012 | Huang et al. |
| 8,174,383 B1 | 5/2012 | Chung et al. |
| 8,249,500 B2 | 8/2012 | Wilson |
| 8,723,551 B2 | 5/2014 | Cho |
| 8,751,846 B2 | 6/2014 | Yu et al. |
| 9,117,128 B2 | 8/2015 | Mats et al. |
| 9,165,171 B2 | 10/2015 | Murdoch et al. |
| 9,418,263 B2 | 8/2016 | Butler et al. |
| 9,991,937 B2 | 6/2018 | Kim |
| 10,018,744 B2 | 7/2018 | Roy |
| 10,116,353 B2 | 10/2018 | Jung |

(56) References Cited

U.S. PATENT DOCUMENTS

| | | | |
|---|---|---|---|
| 10,447,465 | B2 | 10/2019 | Stott |
| 2002/0105436 | A1 | 8/2002 | Bell |
| 2003/0132893 | A1 | 7/2003 | Forster et al. |
| 2003/0151450 | A1 | 8/2003 | Nguyen |
| 2004/0070500 | A1 | 4/2004 | Pratt et al. |
| 2004/0113790 | A1 | 6/2004 | Hamel |
| 2004/0136436 | A1 | 7/2004 | Ainspan |
| 2005/0024287 | A1 | 2/2005 | Jo et al. |
| 2005/0085316 | A1 | 4/2005 | Ban |
| 2005/0130601 | A1* | 6/2005 | Palermo ............... H03J 1/0008 455/73 |
| 2005/0181750 | A1 | 8/2005 | Pinks |
| 2005/0215219 | A1 | 9/2005 | Khorram |
| 2006/0004424 | A1* | 1/2006 | Loeb ................... A61N 1/3605 607/11 |
| 2006/0094425 | A1* | 5/2006 | Mickle ............... G06K 19/0715 455/434 |
| 2007/0010295 | A1 | 1/2007 | Greene |
| 2007/0018819 | A1 | 1/2007 | Streeb |
| 2007/0026826 | A1 | 2/2007 | Wilson |
| 2007/0075140 | A1 | 4/2007 | Guez |
| 2007/0090926 | A1 | 4/2007 | Potyrailo |
| 2007/0099589 | A1* | 5/2007 | Kawai ...................... H04B 1/18 455/193.1 |
| 2007/0210923 | A1 | 9/2007 | Butler |
| 2007/0222605 | A1* | 9/2007 | Andresky .......... G06K 7/10316 340/572.7 |
| 2007/0232236 | A1 | 10/2007 | Kasha |
| 2008/0079398 | A1 | 4/2008 | Li |
| 2008/0136619 | A1 | 6/2008 | Moran |
| 2008/0186137 | A1 | 8/2008 | Butler |
| 2008/0194200 | A1 | 8/2008 | Keen |
| 2008/0227478 | A1 | 9/2008 | Greene |
| 2008/0266005 | A1* | 10/2008 | Jacobsson ............... H03B 5/124 331/108 A |
| 2009/0002175 | A1* | 1/2009 | Waters ............... G06K 19/0726 340/572.5 |
| 2009/0038623 | A1 | 2/2009 | Farbarik |
| 2009/0108805 | A1 | 4/2009 | Liu |
| 2009/0186584 | A1 | 7/2009 | Lambrecht |
| 2009/0207037 | A1 | 8/2009 | Wiberg |
| 2010/0039234 | A1 | 2/2010 | Soliven |
| 2010/0179389 | A1 | 7/2010 | Moroney |
| 2010/0245052 | A1 | 9/2010 | Kitayoshi |
| 2010/0265189 | A1 | 10/2010 | Rofourgaran |
| 2010/0279751 | A1 | 11/2010 | Pourseyed |
| 2010/0286841 | A1 | 11/2010 | Subbloie |
| 2010/0308974 | A1 | 12/2010 | Rowland |
| 2010/0326145 | A1 | 12/2010 | Powers |
| 2010/0327766 | A1 | 12/2010 | Recker |
| 2011/0081857 | A1 | 4/2011 | Lee |
| 2011/0130093 | A1* | 6/2011 | Walley ................... H02J 50/12 307/104 |
| 2011/0158329 | A1 | 6/2011 | Oettinger |
| 2011/0221569 | A1 | 9/2011 | Hamel |
| 2012/0063505 | A1 | 3/2012 | Okamura |
| 2012/0068003 | A1 | 3/2012 | Bajekal |
| 2012/0081145 | A1 | 4/2012 | Lee |
| 2012/0149303 | A1 | 6/2012 | Moes |
| 2012/0155344 | A1 | 6/2012 | Wiley |
| 2012/0161536 | A1 | 6/2012 | Kamata |
| 2012/0235636 | A1 | 9/2012 | Partovi |
| 2013/0013022 | A1* | 1/2013 | De Oliveira Barroso Júnior ........ A61F 5/48 607/41 |
| 2013/0026847 | A1 | 1/2013 | Kim |
| 2013/0095759 | A1 | 4/2013 | Andersen |
| 2013/0022649 | A1 | 8/2013 | Gudem |
| 2013/0204202 | A1 | 8/2013 | Trombly |
| 2013/0214611 | A1* | 8/2013 | Bae ........................ H01F 38/14 307/104 |
| 2013/0217327 | A1* | 8/2013 | Kanno ................ H04B 5/0056 455/41.1 |
| 2013/0285606 | A1 | 10/2013 | Ben-Shalom |
| 2014/0045425 | A1 | 2/2014 | Roh |
| 2014/0070898 | A1 | 3/2014 | Shirinfar |
| 2014/0080409 | A1* | 3/2014 | Frankland .......... H02J 7/00034 455/41.1 |
| 2014/0085057 | A1 | 3/2014 | Horst |
| 2014/0107448 | A1 | 4/2014 | Liu |
| 2014/0163316 | A1 | 6/2014 | Koide |
| 2014/0285336 | A1 | 9/2014 | Kates |
| 2014/0350872 | A1 | 11/2014 | Xu |
| 2015/0054453 | A1 | 2/2015 | White et al. |
| 2015/0079903 | A1 | 3/2015 | Song |
| 2015/0188671 | A1 | 7/2015 | Distasi |
| 2015/0243432 | A1 | 8/2015 | Laifenfeld |
| 2015/0270876 | A1 | 9/2015 | Kim |
| 2015/0355037 | A1 | 12/2015 | Cottin |
| 2015/0358912 | A1 | 12/2015 | Tsukamoto |
| 2016/0034724 | A1 | 2/2016 | Zumsteg |
| 2016/0191088 | A1 | 6/2016 | Turlikov |
| 2016/0310077 | A1 | 10/2016 | Hunter |
| 2017/0223807 | A1 | 8/2017 | Recker |

FOREIGN PATENT DOCUMENTS

| | | |
|---|---|---|
| DE | 603081132 T2 | 3/2007 |
| EP | 0407848 A2 | 1/1991 |
| EP | 0568067 A1 | 11/1993 |
| EP | 0801358 A2 | 10/1997 |
| EP | 0615136 B1 | 3/1999 |
| EP | 1691320 B1 | 10/2007 |
| EP | 1960947 B1 | 9/2010 |
| GB | 2321726 A | 8/1998 |
| WO | 2004019055 A1 | 3/2004 |

OTHER PUBLICATIONS

Butler et al.; Multiple Radio Frequency Network Node RFID Tag; Specification for U.S. Appl. No. 60/180,1612; EFSWeb; TEGO-0003-P60; for US. Pat. No. 9,418,263.

Chow, et al.; New Voltage Level Shifting Circuits for High Performance CMOS Interface Applications; WSEAS Transactions on Circuits and Systems; Jun. 2004; No. 4, vol. 3; pp 975-979.

EPCGlobal, Inc.; EPC™ Radio-Frequency Identity Protocols Class-1 Generation-2 UHF RFID Protocol for Communications at 860 MHz-960 MHz; Version 1.0.4; Sep. 8, 2004; pp. 1-88.

Heller, et al.; Session I: Custom and Semi-Custom Design Techniques; WAM 1.3: Cascode Voltage Switch Logic: A Differential CMOS logic Family.

Kaiser et al.; A Low Transponder IC for High Performance Identification Systems; IEEE Custom Integrated Circuits Conference; 1994; pp. 335-338.

Landt; The history of RFID; IEEE Potentials; Oct.-Nov. 2005; vol. 24, No. 4; pp. 8-11.

Lee, et al.; MicroID™ 13.56 MHz RFID System Design Guide; 2001; 164 Pgs.

Mandal; Far Field RF Power Extraction Circuits and Systems; MIT; 2004; 199 pgs.

Rao et al.; Antenna Design for UHF RFID Tags: A Review and a Practical Application; IEEE Transactions on Antennas and Propagation; vol. 53, No. 12; pp. 3870-3876; Dec. 2005.

Serneels, et al.; A High speed, Low Voltage to High Voltage Level Shifter in Standard 1.2V 0.13 μm CMOS; 2006 13th IEEE International Conference on Electronics, Circuits and Systems; Dec. 10-13, 2006; pp. 668-671.

Turner; Wireless, A Treatise on the Theory and Practice of High-Frequency Electric Signaling; 1931.

U.S. War Department; Technical Manual 11-455; Radio Fundamentals; 1944.

Uyemura; CMOS Logic Circuit Design; 2001.

Want; An Introduction to RFID Technology; IEEE Pervasive Computing; Jan.-Mar. 2006; vol. 5, No. 1; pp. 25-33.

* cited by examiner

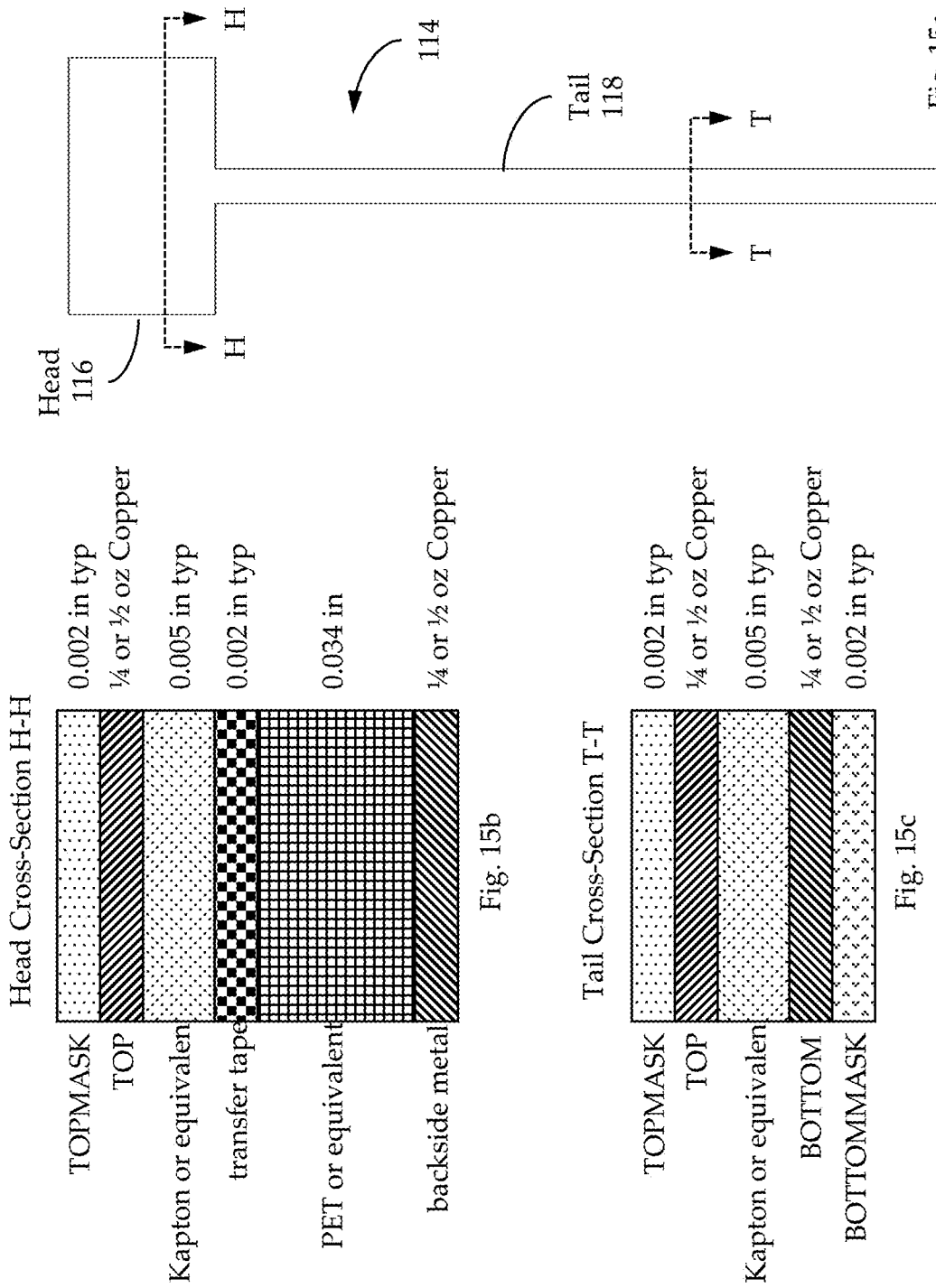

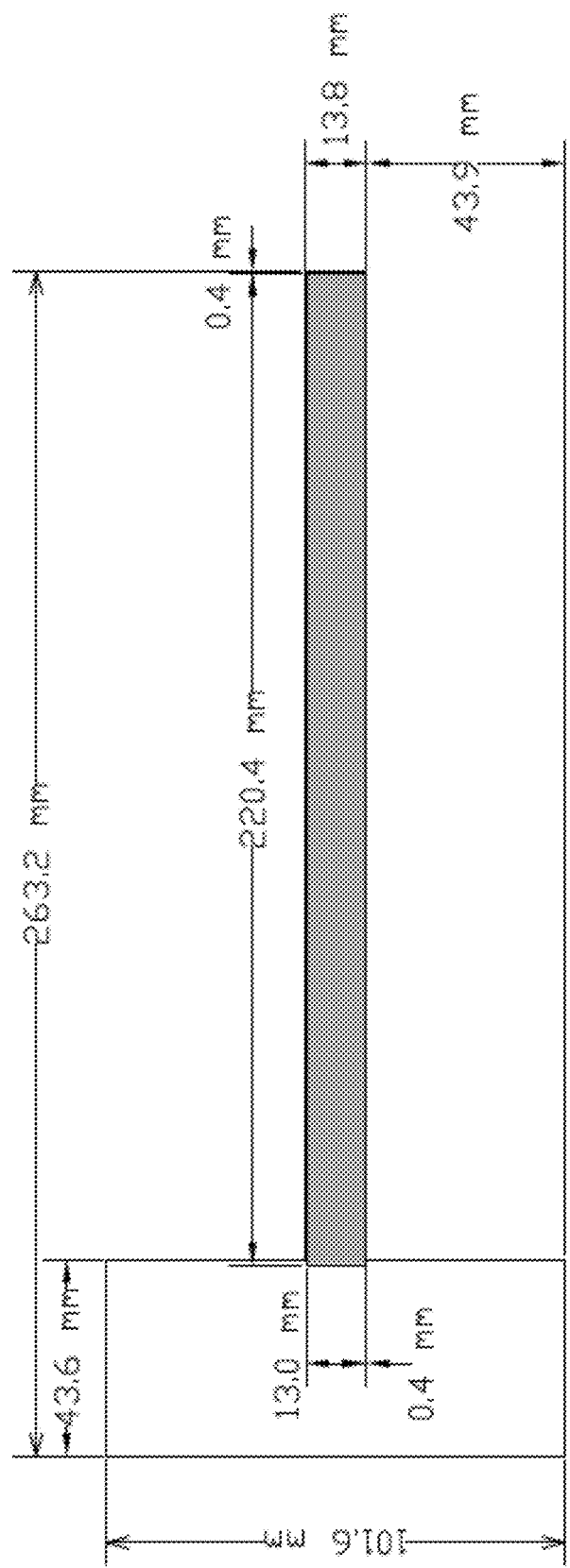
Fig. 15g BOTTOMMASK

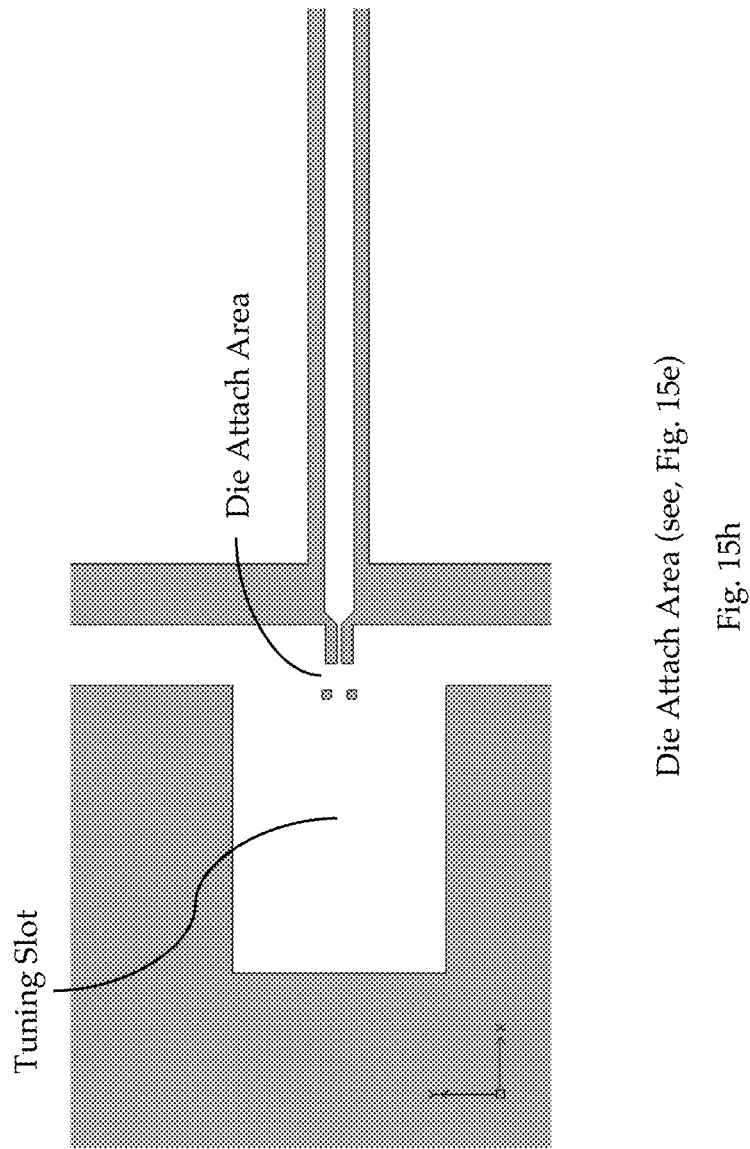

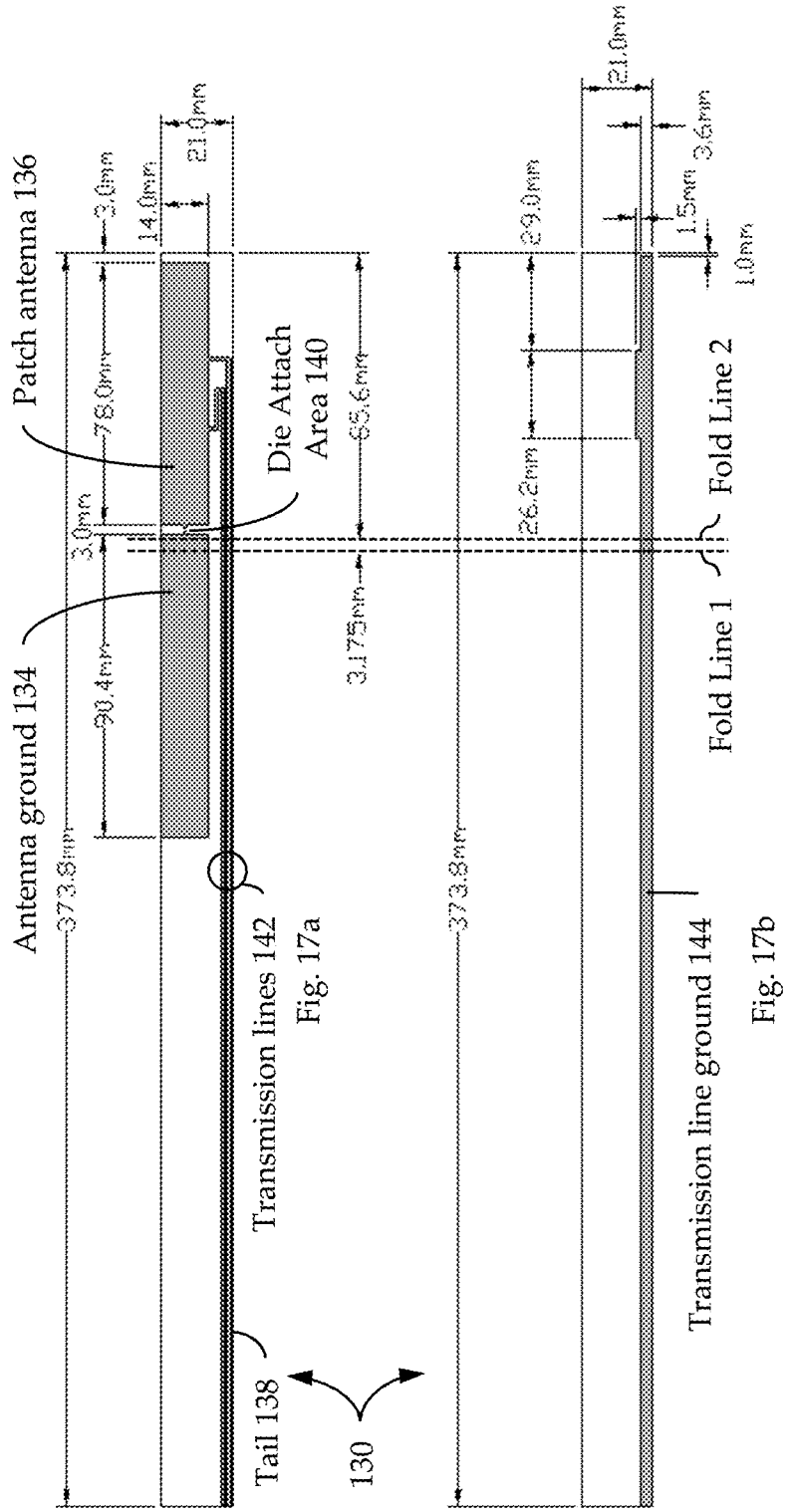

RADIO FREQUENCY (RF) FIELD STRENGTH DETECTING CIRCUIT

CROSS-REFERENCE TO RELATED APPLICATIONS

The present U.S. Utility Patent Application claims priority pursuant to 35 U.S.C. § 120 as a continuation of U.S. Utility application Ser. No. 16/846,951, entitled "WIRELESS SENSOR INCLUDING AN RF SIGNAL CIRCUIT", filed 13 Apr. 3030, issuing as U.S. Pat. No. 11,064,373 on 13 Jul. 2021, which is a continuation of U.S. Utility application Ser. No. 16/183,578, entitled "WIRELESS SENSOR INCLUDING AN RF SIGNAL CIRCUIT", filed 8 Nov. 2018, now U.S. Pat. No. 10,623,970, issued on 14 Apr. 2020, which is a continuation of U.S. Utility application Ser. No. 15/272,907, entitled "WIRELESS SENSOR INCLUDING AN RF SIGNAL CIRCUIT", filed 22 Sep. 2016, now U.S. Pat. No. 10,149,177, issued on 4 Dec. 2018, which claims priority pursuant to 35 U.S.C. § 119(e) to U.S. Provisional Application No. 62/221,907, entitled "Active Self-Calibrating RFID Sensors", filed 22 Sep. 2015 which is hereby incorporated herein by reference in its entirety and made part of the present U.S. Utility Patent Application for all purposes.

U.S. Utility application Ser. No. 15/272,907 also claims priority pursuant to 35 U.S.C. § 120 as a continuation-in-part of U.S. Utility application Ser. No. 14/256,877, entitled "METHOD AND APPARATUS FOR SENSING ENVIRONMENT USING A WIRELESS PASSIVE SENSOR", filed 18 Apr. 2014, now U.S. Pat. No. 9,785,807, issued on 10 Oct. 2017, which claims priority pursuant to 35 U.S.C. § 119(e) to:
1. U.S. Provisional Application Ser. No. 61/814,241, filed 20 Apr. 2013, ("Parent Provisional Three");
2. U.S. Provisional Application Ser. No. 61/833,150, filed 10 Jun/2013, ("Parent Provisional Four");
3. U.S. Provisional Application Ser. No. 61/833,167, filed 10 Jun. 2013, ("Parent Provisional Five");
4. U.S. Provisional Application Ser. No. 61/833,265, filed 10 Jun. 2013, ("Parent Provisional Six");
5. U.S. Provisional Application Ser. No. 61/871,167, filed 28 Aug. 2013, ("Parent Provisional Seven");
6. U.S. Provisional Application Ser. No. 61/875,599, filed 9 Sep. 2013, ("Parent Provisional Eight");
7. U.S. Provisional Application Ser. No. 61/896,102, filed 27 Oct. 2013, ("Parent Provisional Nine");
8. U.S. Provisional Application Ser. No. 61/929,017, filed 18 Jan. 2014, ("Parent Provisional Ten");
9. U.S. Provisional Application Ser. No. 61/934,935, filed 3 Feb. 2014, ("Parent Provisional Eleven"); collectively, "Parent Provisional References", and hereby claims benefit of the filing dates thereof pursuant to 37 CFR § 1.78(a)(4).

U.S. Utility application Ser. No. 14/256,877 is also a Continuation-In-Part of application Ser. No. 13/209,420, filed 14 Aug. 2011 ("Parent Application One"), now U.S. Pat. No. 8,749,319, issued on 10 Jun. 2014, which claims priority to U.S. Provisional Application Ser. No. 61/428,170, filed 29 Dec. 2010 ("Parent Provisional One") and U.S. Provisional Application Ser. No. 61/485,732, filed 13 May 2011 ("Parent Provisional Two"). Parent Application One (Ser. No. 13/209,420) is, in turn, a Continuation-In-Part of application Ser. No. 12/462,331, filed 1 Aug. 2009, which is now U.S. Pat. No. 8,081,043, issued 20 Dec. 2011 ("Parent Patent One"), which is a Divisional of U.S. Utility application Ser. No. 11/601,085, filed 18 Nov. 2006, now U.S. Pat. No. 7,586,385, issued on 8 Sep. 2009.

U.S. Utility application Ser. No. 14/256,877 is also a Continuation-In-Part of application Ser. No. 13/209,425, filed simultaneously with the "Parent Application One" on 14 Aug. 2011 ("Related Co-application"), now U.S. Pat. No. 9,048,819, issued on 2 Jun. 2015, which claims priority pursuant to 35 U.S.C. § 119(e) to U.S. Provisional Application No. 61/428,170, filed 29 Dec. 2010 and U.S. Provisional Application No. 61/485,732, filed 13 May 2011, and U.S. Utility application Ser. No. 13/209,425 also claims priority pursuant to 35 U.S.C. § 120 as a Continuation-in-Part of U.S. Utility application Ser. No. 12/462,331, filed 1 Aug. 2009, now U.S. Pat. No. 8,081,043, issued on 20 Dec. 2011, which is a Divisional of U.S. Utility application Ser. No. 11/601,085, filed 18 Nov. 2006, now U.S. Pat. No. 7,586,385, issued on 8 Sep. 2009.

U.S. Utility application Ser. No. 14/256,877 is also a Continuation-In-Part of application Ser. No. 13/467,925, filed 9 May 2012 ("Parent Application Two"), now U.S. Pat. No. 10,224,902, issued on 5 Mar. 2019, which is a Continuation-in-Part of U.S. Utility application Ser. No. 13/209,425, filed 14 Aug. 2011, now U.S. Pat. No. 9,048,819, issued on 2 Jun. 2015, which claims priority pursuant to 35 U.S.C. § 119(e) to U.S. Provisional Application No. 61/428,170, filed 29 Dec. 2010 and U.S. Provisional Application No. 61/485,732, filed 13 May 2011, and U.S. Utility application Ser. No. 13/209,425 also claims priority pursuant to 35 U.S.C. § 120 as a Continuation-in-Part of U.S. Utility application Ser. No. 12/462,331, filed 1 Aug. 2009, now U.S. Pat. No. 8,081,043, issued on 20 Dec. 2011, which is a Divisional of U.S. Utility application Ser. No. 11/601,085, filed 18 Nov. 2006, now U.S. Pat. No. 7,586,385, issued on 8 Sep. 2009.

The subject matter of the Parent Applications One, Two and Three, Parent Patent One, the Related Co-application, and the Parent Provisional References (collectively, "Related References"), each in its entirety, is expressly incorporated herein by reference.

BACKGROUND OF THE INVENTION

1. Field of the Invention

The present invention relates generally to sensing a detectable environmental condition, and, in particular, to sensing a detectable environmental condition in a passive RFID system.

2. Description of the Related Art

In general, in the descriptions that follow, we will italicize the first occurrence of each special term of art that should be familiar to those skilled in the art of radio frequency ("RF") communication systems. In addition, when we first introduce a term that we believe to be new or that we will use in a context that we believe to be new, we will bold the term and provide the definition that we intend to apply to that term. In addition, throughout this description, we will sometimes use the terms assert and negate when referring to the rendering of a signal, signal flag, status bit, or similar apparatus into its logically true or logically false state, respectively, and the term toggle to indicate the logical inversion of a signal from one logical state to the other. Alternatively, we may refer to the mutually exclusive boolean states as logic_O and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

In accordance with our prior invention previously disclosed in the Related References, the amplitude modulated ("AM") signal broadcast by the reader in an RFID system will be electromagnetically coupled to a conventional antenna, and a portion of the current induced in a tank circuit is extracted by a regulator to provide operating power for all other circuits. Once sufficient stable power is available, the regulator will produce, e.g., a power-on-reset signal to initiate system operation. Thereafter, the method disclosed in the Related References, and the associated apparatus, dynamically varies the capacitance of a variable capacitor component of the tank circuit so as to dynamically shift the $f_R$ of the tank circuit to better match the $f_C$ of the received RF signal, thus obtaining maximum power transfer in the system.

In general, the invention disclosed in the Related References focused primarily on quantizing the voltage developed by the tank circuit as the primary means of matching the $f_R$ of the tank circuit to the transmission frequency, $f_C$, of the received signal. However, this voltage quantization is, at best, indirectly related to received signal field strength. In the First Related Application, we disclosed an effective and efficient method and apparatus for quantizing the received field strength as a function of induced current. In particular, we disclosed a method and apparatus adapted to develop this field quantization in a form and manner that is suitable for selectively varying the input impedance of the receiver circuit to maximize received power, especially during normal system operation. Additionally, in light of the power sensitive nature of RFID systems, our disclosed method and apparatus varied the input impedance with a minimum power loss.

In Parent Application One, we have disclosed generally the use of our method and apparatus to sense changes to an environment to which the RFID tag is exposed. In this application, we will further develop this capability and disclose embodiments specifically adapted to operate in a variety of environments.

BRIEF SUMMARY OF THE INVENTION

In accordance with a first embodiment of our invention, we provide an RF-based environmental sensing system comprising a special antenna arrangement, and an RF transceiver. In this embodiment, the antenna arrangement comprises: an antenna having an antenna impedance; and a transmission line operatively coupled to said antenna and adapted selectively to modify the antenna impendence. Further, the RF transceiver comprises: a tank circuit operatively coupled to the antenna and having a selectively variable impedance; and a tuning circuit adapted to dynamically vary the impedance of the tank circuit, and to develop a first quantized value representative of the impedance of said tank circuit, wherein the first quantized value is a function of the modified antenna impedance.

Further, we provide a method for operating the first embodiment comprising the steps of: exposing the transmission line to a selected environmental condition; dynamically varying the impedance of the tank circuit substantially to match the modified antenna impedance; and using the first value to sense the environmental condition.

In accordance with another embodiment of our invention, we provide an environmental sensing method for use in an RF system comprising the steps of: calibrating an RF sensor by developing a first calibration value indicative of an absence of a detectable quantity of a substance and a second calibration value indicative of a presence of the detectable quantity of the substance; installing the sensor in a structure; exposing the structure to the substance; interrogating the sensor to retrieve a sensed value; and detecting the presence of the substance in the structure as a function of the sensed value relative to the first and second calibration values.

BRIEF DESCRIPTION OF THE SEVERAL VIEWS OF THE DRAWINGS

My invention may be more fully understood by a description of certain preferred embodiments in conjunction with the attached drawings in which:

FIGS. 15*a* through 15h, illustrate an antenna constructed in accordance with one embodiment of the present invention, wherein: FIG. 15*a* illustrates in top plan view a fully assembled antenna; FIG. 15*b* and FIG. 15*c* illustrate, in cross-section, the several layers comprising a head and a tail portion, respectively, of the antenna; FIG. 15*d* through FIG. 15*g* illustrate, in plan view, the several separate layers of the antenna as shown in FIG. 15*b* and FIG. 15*c*; and FIG. 15*h* illustrates, in partial plan view, a close-up depiction of a central, slot portion of the antenna of FIG. 15*a* (as noted in FIG. 15e) showing in greater detail the construction of antenna elements to which an RFID tag die may be attached;

FIG. 17a and FIG. 17b, illustrates a folded, patch antenna constructed in accordance with one other embodiment of the present invention, wherein: FIG. 17a illustrates, in plan view, the top layer of the antenna after placement of the RFID tag die but before folding along fold lines 1 and 2; and FIG. 17b illustrates, also in plan view, the bottom layer of the antenna as shown in FIG. 17a.

Figure 1:
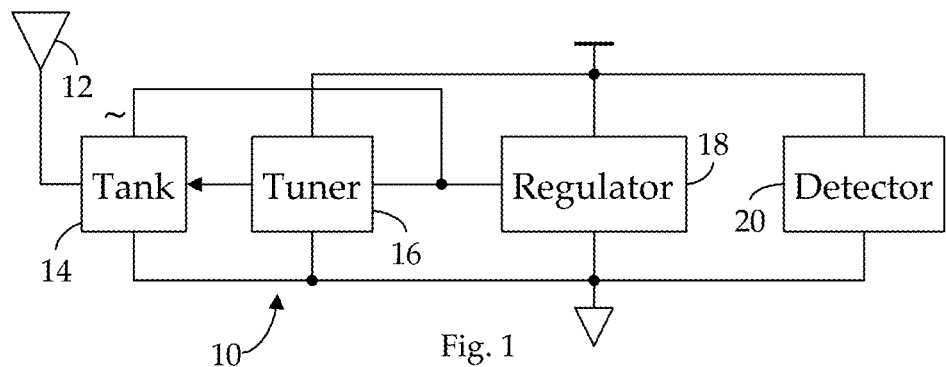
FIG. 1 illustrates, in block diagram form, an RF receiver circuit having a field strength detector constructed in accordance with an embodiment of our invention.

In the drawings, similar elements will be similarly numbered whenever possible. However, this practice is simply for convenience of reference and to avoid unnecessary proliferation of numbers, and is not intended to imply or suggest that our invention requires identity in either function or structure in the several embodiments.

DETAILED DESCRIPTION OF THE INVENTION

Shown in FIG. 1 is an RF receiver circuit 10 suitable for use in an RFID application. As we have described in our Related References, an RF signal electromagnetically coupled to an antenna 12 is received via a tank circuit 14, the response frequency, $f_R$, of which is dynamically varied by a tuner 16 to better match the transmission frequency, $f_C$ of the received RF signal, thus obtaining a maximum power transfer. In particular, as further noted in the Related Applications, the RMS voltage induced across the tank circuit 14 by the received RF signal is quantized by tuner 16 and the developed quantization employed to control the impedance of the tank circuit 14. As also described in the Related References, the unregulated, AC current induced in the tank circuit 14 by the received RF signal is conditioned by a regulator 18 to provide regulated DC operating power to the receiver circuit 10. In accordance with our present invention, we now provide a field strength detector 20, also known as a power detector, adapted to develop a field-strength value as a function of the field strength of the received RF signal. As we have indicated in FIG. 1, our field strength detector 20 is adapted to cooperate with the regulator 18 in the development of the field-strength value. As we shall disclose below, if desired, our field strength detector 20 can be adapted to cooperate with the tuner 16 in controlling the operating characteristics of the tank circuit 14.

Figure 2:
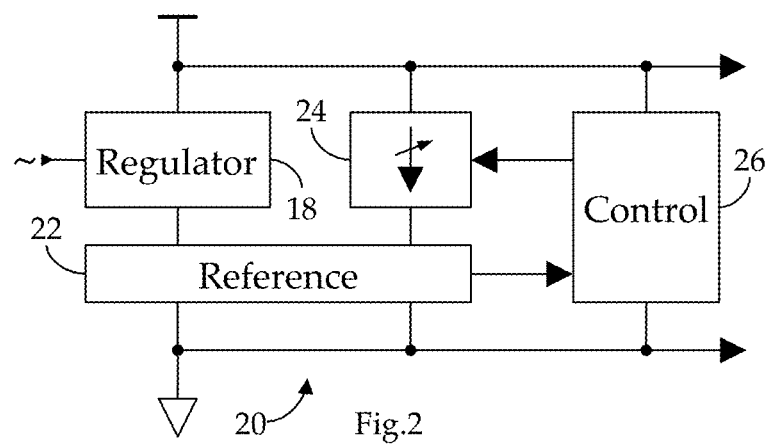
FIG. 2 illustrates, in block diagram form, a field strength detector circuit constructed in accordance with an embodiment of our invention.

Shown by way of example in FIG. 2 is one possible embodiment of our field strength or power detector 20. In this embodiment, we have chosen to employ a shunt-type regulator 18 so that, during normal operation, we can use the shunted 'excess' current as a reference against which we develop the field-strength value. In this regard, we use a reference 22 first to develop a shunt current reference value proportional to the shunted current, and then to develop a mirrored current reference value as a function of both the shunted current and a field strength reference current provided by a digitally controlled current source 24. Preferably, once the tuner 16 has completed its initial operating sequence, whereby the $f_R$ of the tank circuit 14 has been substantially matched to the $f_C$ of the received signal, we then enable a digital control 26 to initiate operation of the current source 24 at a predetermined, digitally-established minimum field strength reference current. After a predetermined period of time, control 26 captures the mirrored current reference value provided by the current reference 22, compares the captured signal against a predetermined threshold value, and, if the comparison indicates that the field strength reference current is insufficient, increases, in accordance with a predetermined sequence of digital-controlled increments, the field strength reference current; upon the comparison indicating that the field strength reference current is sufficient, control 26 will, at least temporarily, cease operation.

In accordance with our invention, the digital field-strength value developed by control 26 to control the field strength current source 24 is a function of the current induced in the tank circuit 14 by the received RF signal. Once developed, this digital field-strength value can be employed in various ways. For example, it can be selectively transmitted by the RFID device (using conventional means) back to the reader (not shown) for reference purposes. Such a transaction can be either on-demand or periodic depending on system requirements. Imagine for a moment an application wherein a plurality of RFID tag devices are distributed, perhaps randomly, throughout a restricted, 3-dimensional space, e.g., a loaded pallet. Imagine also that the reader is programmed to query, at an initial field strength, all tags "in bulk" and to command all tags that have developed a field-strength value greater than a respective field-strength value to remain 'silent'. By performing a sequence of such operations, each at an increasing field strength, the reader will, ultimately, be able to isolate and distinguish those tags most deeply embedded within the space; once these 'core' tags have been read, a reverse sequence can be performed to isolate and distinguish all tags within respective, concentric 'shells' comprising the space of interest. Although, in all likelihood, these shells will not be regular in either shape or relative volume, the analogy should still be apt.

Figure 3:
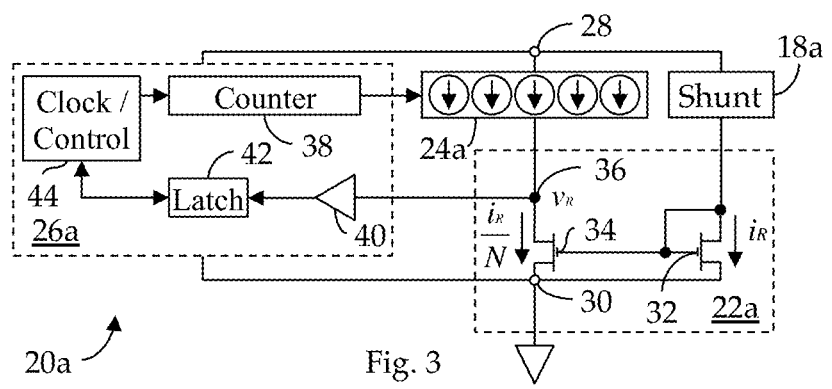
FIG. 3 illustrates, in block schematic form, a more detailed embodiment of the field strength detector circuit shown in FIG. 2.

In FIG. 3, we have illustrated one possible embodiment of our field strength detector 20a. In general, we have chosen to use a shunt circuit 18a to develop a substantially constant operating voltage level across supply node 28 and ground node 30. Shunt regulators of this type are well known in the art, and typically use Zener diodes, avalanche breakdown diodes, diode-connected MOS devices, and the like.

As can be seen, we have chosen to implement current reference 22 in the form of a current mirror circuit 22a, connected in series with shunt circuit 18a between nodes 28 and 30. As is typical, current mirror circuit 22a comprises a diode-connected reference transistor 32 and a mirror transistor 34. If desired, a more sophisticated circuit such as a Widlar current source may be used rather than this basic two-transistor configuration. For convenience of reference, we have designated the current shunted by shunt circuit 18a via reference transistor 32 as $i_R$; similarly, we have designated the current flowing through mirror transistor 34 as $i_R/N$, wherein, as is known, N is the ratio of the widths of reference transistor 32 and mirror transistor 34.

We have chosen to implement the field strength current source 24 as a set of n individual current sources 24a, each connected in parallel between the supply node 28 and the mirror transistor 34. In general, field strength current source 24a is adapted to source current at a level corresponding to an n-bit digital control value developed by a counter 38. In the illustrated embodiment wherein n=5, field strength current source 24a is potentially capable of sourcing thirty-two distinct reference current levels. We propose that the initial, minimum reference current level be selected so as to be less than the current carrying capacity of the mirror transistor 34 when the shunt circuit 18a first begins to shunt excess induced current through reference transistor 32; that the maximum reference current level be selected so as to be greater than the current carrying capacity of the mirror transistor 34 when the shunt circuit 18a is shunting a maximum anticipated amount of excess induced current; and that the intermediate reference current levels be distributed relatively evenly between the minimum and maximum levels. Of course, alternate schemes may be practicable, and, perhaps, desirable depending on system requirements.

Within control 26a, a conventional analog-to-digital converter ("ADC") 40, having its input connected to a sensing node 36, provides a digital output indicative of the field strength reference voltage, $v_R$, developed on sensing node 36. In one embodiment, ADC 40 may comprise a comparator circuit adapted to switch from a logic_O state to a logic_1 when sufficient current is sourced by field strength current source 24a to raise the voltage on sensing node 36 above a predetermined reference voltage threshold, v~. Alternatively, ADC 40 may be implemented as a multi-bit ADC capable of providing higher precision regarding the specific voltage developed on sensing node 36, depending on the requirements of the system. Sufficient current may be characterized as that current sourced by the field strength current source 24a or sunk by mirror transistor 34 such that the voltage on sensing node 36 is altered substantially above or below a predetermined reference voltage threshold, $v_{th}$. In the exemplary case of a simple CMOS inverter, $v_{th}$ is, in its simplest form, one-half of the supply voltage (VDD/2). Those skilled in the art will appreciate that $v_{th}$ may by appropriately modified by altering the widths and lengths of the devices of which the inverter is comprised. In the exemplary case a multi-bit ADC, $v_{th}$ may be established by design depending on the system requirements and furthermore, may be programmable by the system.

In the illustrated embodiment, a latch 42 captures the output state of ADC 40 in response to control signals provided by a clock/control circuit 44. If the captured state is logic_O, the clock/control circuit 44 will change counter 38 to change the reference current being sourced by field strength current source 24a; otherwise clock/control circuit 44 will, at least temporarily, cease operation. However, notwithstanding, the digital field-strength value developed by counter 38 is available for any appropriate use, as discussed above.

Figure 4:
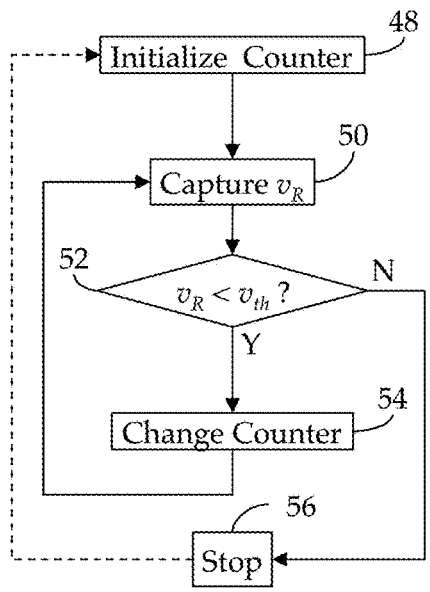
FIG. 4 illustrates, in flow diagram form, the sequencing of operations in the field strength detector circuit shown in FIG. 3.

By way of example, we have illustrated in FIG. 4 one possible general operational flow of our field strength detector 20a. Upon activation, counter 38 is set to its initial digital field-strength value (step 48), thereby enabling field strength current source 24a to initiate reference current sourcing at the selected level. After an appropriate settling time, the field strength reference voltage, $v_R$, developed on sensing node 36 and digitized by ADC 40 is captured in latch 42 (step 50). If the captured field strength reference voltage, $v_R$, is less than (or equal to) the predetermined reference threshold voltage, $v_{th}$, clock/control 44 will change counter 38 (step 54). This process will repeat, changing the reference current sourced by field strength current source 24a until the captured field strength reference voltage, $v_R$, is greater than the predetermined reference threshold voltage, $v_{th}$ (at step 52), at which time the process will stop (step 56). As illustrated, this sweep process can be selectively reactivated as required, beginning each time at either the initial field-strength value or some other selected value within the possible range of values as desired.

Figure 5:
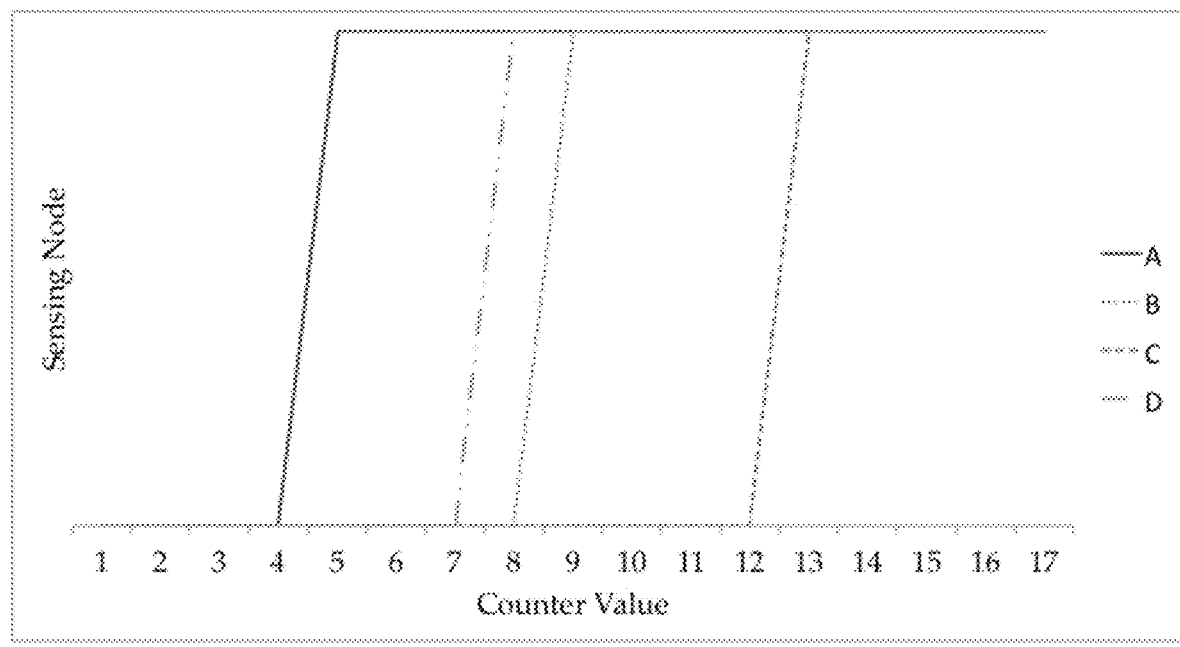
FIG. 5 illustrates, in graph form, the response of the field strength detector circuit shown in FIG. 3 to various conditions.

The graph illustrated in FIG. 5 depicts several plots of the voltage developed on sensing node 36 as the field strength detector circuit 20a sweeps the value of counter 38 according to the flow illustrated in FIG. 4. As an example, note that the curve labeled "A" in FIG. 5 begins at a logic_O value when the value of counter 38 is at a minimum value such as "1" as an exemplary value. Subsequent loops though the sweep loop gradually increase the field strength reference voltage on sensing node 36 until counter 38 reaches a value of "4" as an example. At this point, the "A" plot in FIG. 5 switches from a logic_O value to a logic_1 value, indicating that the field strength reference voltage, $v_R$, on sensing node 36 has exceeded the predetermined reference threshold voltage, $v_{th}$. Other curves labeled "B" through "D" depict incremental increases of reference currents, $i_R$, flowing through reference device 32, resulting in correspondingly higher mirrored currents flowing through mirror device 34. This incrementally higher mirror current requires field strength current source 24 to source a higher current level which in turn corresponds to higher values in counter 38. Thus, it is clear that our invention is adapted to effectively and efficiently develop a digital representation of the current flowing through sensing node 36 that is suitable for any appropriate use.

Figure 6:
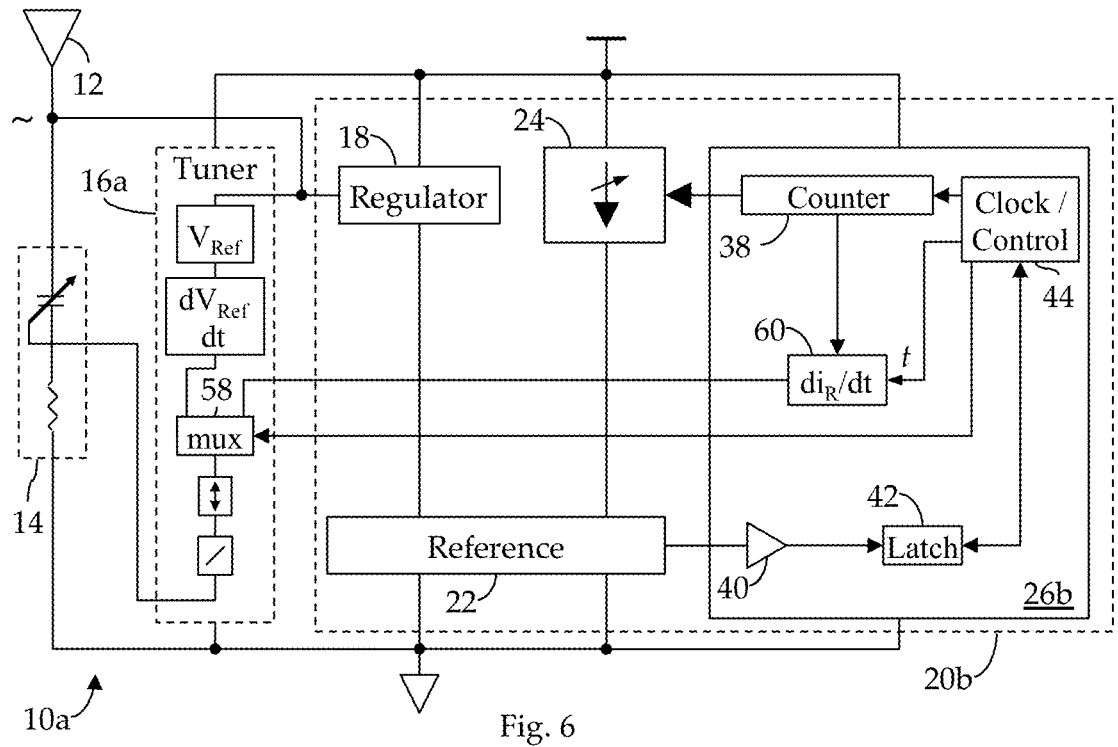
FIG. 6 illustrates, in block schematic form, an RF receiver circuit constructed in accordance with another embodiment of our invention.

One such use, as discussed earlier, of our field strength detector 20 is to cooperate with tuner 16 in controlling the operating characteristics of the tank circuit 14. FIG. 6 illustrates one possible embodiment where receiver circuit 10a uses a field strength detector 20b specially adapted to share with tuner 16a the control of the tank circuit 14. In our Related References we have disclosed methods, and related apparatus, for dynamically tuning, via tuner 16a, the tank circuit 14 so as to dynamically shift the $f_R$ of the tank circuit 14 to better match the $f_c$ of the received RF signal at antenna 12. By way of example, we have shown in FIG. 6 how the embodiment shown in FIG. 3 of our Parent Patent may be easily modified by adding to tuner 16a a multiplexer 58 to facilitate shared access to the tuner control apparatus. Shown in FIG. 7 is the operational flow (similar to that illustrated in FIG. 4 in our Parent Patent) of our new field strength detector 20b upon assuming control of tank circuit 14.

Figure 7:
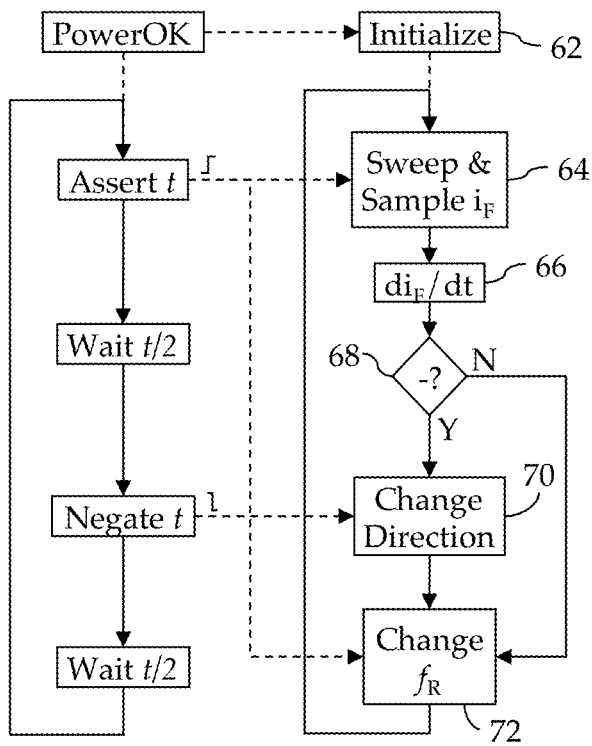
FIG. 7 illustrates, in flow diagram form, the sequencing of the operations in the RF receiver circuit shown in FIG. 6.

In context of this particular use, once tuner 16a has completed its initial operating sequences as fully described in our Parent Patent, and our field strength detector 20b has performed an initial sweep (as described above and illustrated in FIG. 4) and saved in a differentiator 60 a base-line field-strength value developed in counter 38, clock/control 44 commands multiplexer 58 to transfer control of the tank circuit 16a to field strength detector 20b (all comprising step 62 in FIG. 7). Upon completing a second current sweep, differentiator 60 will save the then-current field-strength value developed in the counter 38 (step 64). Thereafter, differentiator 60 will determine the polarity of the change of the previously saved field-strength value with respect to the then-current field-strength value developed in counter 38 (step 66). If the polarity is negative (step 68), indicating that the current field-strength value is lower than the previously-saved field-strength value, differentiator 60 will assert a change direction signal; otherwise, differentiator 60 will negate the change direction signal (step 70). In response, the shared components in tuner 16a downstream of the multiplexer 58 will change the tuning characteristics of tank circuit 14 (step 72) (as fully described in our Related References). Now, looping back (to step 64), the resulting change of field strength, as quantized is the digital field-strength value developed in counter 38 during the next sweep (step 64), will be detected and, if higher, will result in a further shift in the $f_R$ of the tank circuit 14 in the selected direction or, if lower, will result in a change of direction (step 70). Accordingly, over a number of such 'seek' cycles, our invention will selectively allow the receiver 10a to maximize received field strength even if, as a result of unusual factors, the $f_R$ of the tank circuit 14 may not be precisely matched to the $f_c$ of the received RF signal, i.e., the reactance of the antenna is closely matched with the reactance of the tank circuit, thus achieving maximum power transfer. In an alternative embodiment, it would be unnecessary for tuner 16a to perform an initial operating sequence as fully described in our Parent Patent. Rather, field strength detector 20b may be used exclusively to perform both the initial tuning of the receiver circuit 10a as well as the subsequent field strength detection. Note that the source impedance of antenna 12 and load impedance of tank circuit 14 may be represented alternatively in schematic form as in FIG. 8, wherein antenna 12 is represented as equivalent source resistance $R_S$ 74 and equivalent source reactance $X_S$ 76, and tank circuit 14 is represented as equivalent load resistance $R_L$ 78 and equivalent, variable load reactance $X_L$ 80.

Figure 9:
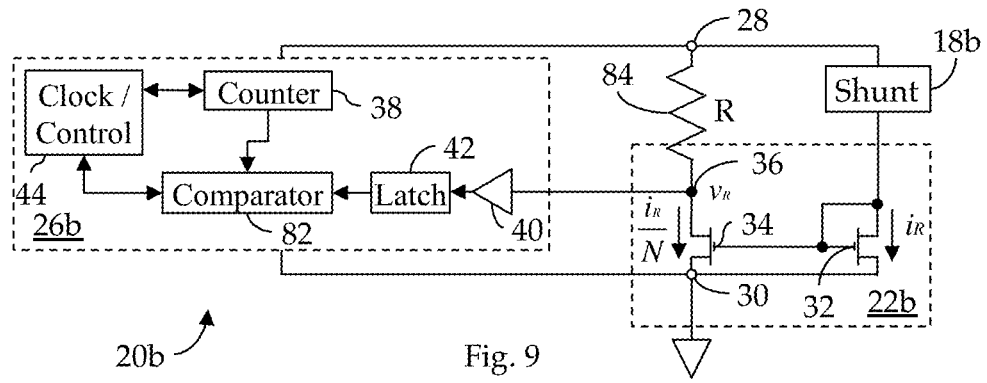
FIG. 9 illustrates, in block schematic form, an alternative exemplary embodiment of the field strength detector circuit shown in FIG. 3.

In FIG. 9, we have illustrated an alternate embodiment of our field strength detector illustrated in FIG. 3. Here, as before, shunt circuit 18b is used to develop a substantially constant operating voltage level across supply node 28 and ground node 30. Also as before, the current reference 22 is implemented as a current mirror circuit 22b connected in series with shunt circuit 18b between nodes 28 and 30. However, in this embodiment, the field strength current source comprises a resistive component 84 adapted to function as a static resistive pull-up device. Many possible implementations exist besides a basic resistor, such as a long channel length transistor, and those skilled in the art will appreciate the various implementations that are available to accomplish analogous functionality. The field strength voltage reference $v_R$ developed on sensing node 36 will be drawn to a state near the supply voltage when the mirrored current flowing though transistor 34 is relatively small, e.g. close to zero amps, indicating a weak field strength. As the field strength increases, the current flowing through mirror transistor 34 will increase, and the field strength voltage reference $v_R$ developed on sensing node 36 will drop proportionally to the mirrored current flowing through mirror transistor 34 as $i_R/N$. ADC 40, having its input connected to sensing node 36, provides a digital output indicative of the field strength reference voltage, $v_R$, developed on sensing node 36, as described previously.

In this alternate embodiment, latch 42 captures the output state of ADC 40 in response to control signals provided by a clock/control circuit 44. As disclosed earlier, the ADC 40 may comprise a comparator circuit. In this instance, ADC 40 is adapted to switch from a logic_1 state to a logic_O when sufficient current is sunk by mirror transistor 34 to lower the voltage on sensing node 36 below a predetermined reference voltage threshold, $v_{th}$. Alternatively, ADC 40 may be implemented as a multi-bit ADC capable of providing higher precision regarding the specific voltage developed on sensing node 36, depending on the requirements of the system. Comparator 82 subsequently compares the captured output state held in latch 42 with a value held in counter 38 that is selectively controlled by clock/control circuit 44. In response to the output generated by comparator 82, clock/control circuit 44 may selectively change the value held in counter 38 to be one of a higher value or a lower value, depending on the algorithm employed. Depending upon the implementation of counter 38 and comparator 82, clock/control circuit 44 may also selectively reset the value of counter 38 or comparator 82 or both. The digital field-strength value developed by counter 38 is available for any appropriate use, as discussed above.

Figure 10:
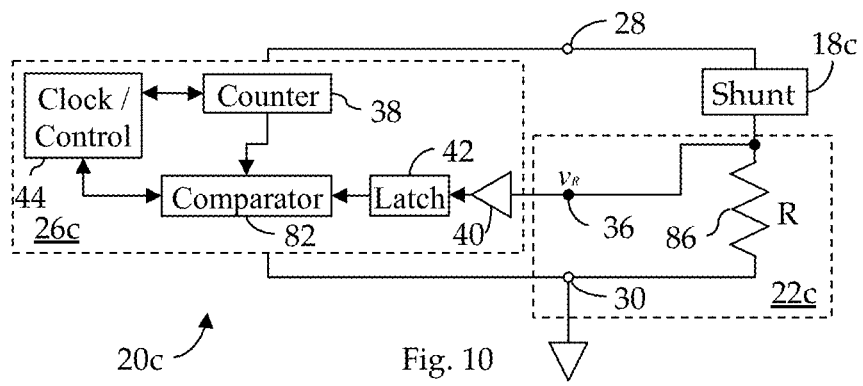
FIG. 10 illustrates, in block schematic form, an alternative exemplary embodiment of the field strength detector circuit shown in FIG. 3.

In FIG. 10, we have illustrated another alternate embodiment of our field strength detector illustrated in FIG. 3. Here, as before, shunt circuit 18c is used to develop a substantially constant operating voltage level across supply node 28 and ground node 30. In this embodiment, the current reference 22 is implemented as a resistive component 86 that functions as a static pull-down device. Many possible implementations exist besides a basic resistor, such as a long channel length transistor and those skilled in the art will appreciate the various implementations that are available to accomplish analogous functionality. The field strength voltage reference $v_R$ developed on sensing node 36 will be drawn to a state near the ground node when the current flowing though shunt circuit 18c is relatively small, e.g. close to zero amps, indicating a weak field strength. As the field strength increase, the current flowing through shunt circuit 18c will increase, and the field strength voltage reference $v_R$ developed on sensing node 36 will rise proportionally to the current flowing through shunt circuit 18c. ADC 40, having its input connected to a sensing node 36, provides a digital output indicative of the field strength reference voltage, $v_R$, developed on sensing node 36, as described previously.

In this alternate embodiment, latch 42 captures the output state of ADC 40 in response to control signals provided by a clock/control circuit 44. As disclosed earlier, the ADC 40 may comprise a comparator circuit. In this instance, ADC 40 is adapted to switch from a logic_O state to a logic_1 when sufficient current is sourced by shunt circuit 18c to raise the voltage on sensing node 36 above a predetermined reference voltage threshold, $v_{th}$. Alternatively, ADC 40 may be implemented as a multi-bit ADC capable of providing higher precision regarding the specific voltage developed on sensing node 36, depending on the requirements of the system.

Comparator 82 subsequently compares the captured output state held in latch 42 with a value held in counter 38 that is selectively controlled by clock/control circuit 44. In response to the output generated by comparator 82, clock/control circuit 44 may selectively change the value held in counter 38 to be one of a higher value or a lower value, depending on the algorithm employed. Depending upon the implementation of counter 38 and comparator 82, clock/control circuit 44 may also selectively reset the value of counter 38 or comparator 82 or both. The digital field-strength value developed by counter 38 is available for any appropriate use, as discussed above.

In another embodiment, our invention may be adapted to sense the environment to which a tag is exposed, as well as sensing changes to that same environment. As disclosed in our Related References, the auto-tuning capability of tuner 16 acting in conjunction with tank circuit 14 detects antenna impedance changes. These impedance changes may be a function of environmental factors such as proximity to interfering substances, e.g., metals or liquids, as well as a function of a reader or receiver antenna orientation. Likewise, as disclosed herein, our field strength (i.e., received power) detector 20 may be used to detect changes in received power (i.e., field strength) as a function of, for example, power emitted by the reader, distance between tag and reader, physical characteristics of materials or elements in the immediate vicinity of the tag and reader, or the like. Sensing the environment or, at least, changes to the environment is accomplished using one or both of these capabilities.

Figure 11:
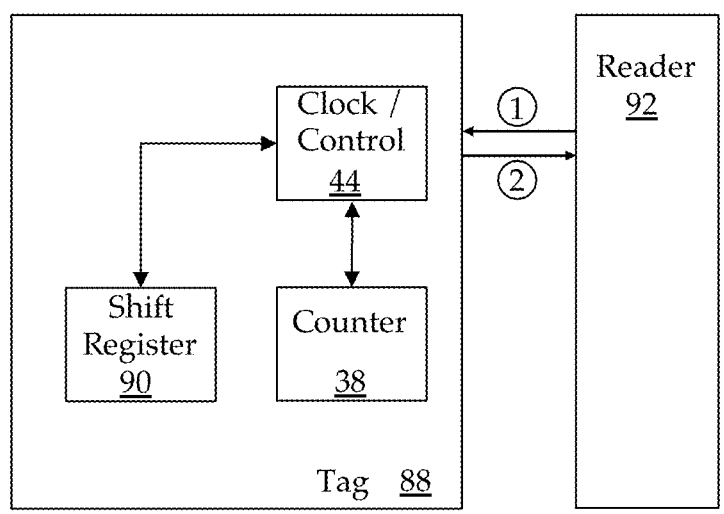
FIG. 11 illustrates, in block schematic form, an exemplary RFID sub-system containing tag and reader.

As an example, the tag 88 of FIG. 11, contains both a source tag antenna 12 (not shown, but see, e.g., FIG. 6) and a corresponding load chip tank circuit 14 (not shown, but see, e.g., FIG. 6). Each contains both resistive and reactive elements as discussed previously (see, e.g., FIG. 8). A tag 88 containing such a tank circuit 14 mounted on a metallic surface will exhibit antenna impedance that is dramatically different than the same tag 88 in free space or mounted on a container of liquid. Shown in Table 1 are exemplary values for impedance variations in both antenna source resistance 74 as well as antenna source reactance 76 as a function of frequency as well as environmental effects at an exemplary frequency.

TABLE 1

Antenna Impedance Variations

|  | 860 MHz | | 870 MHz | | 880 MHz | | 890 MHz | |
| --- | --- | --- | --- | --- | --- | --- | --- | --- |
|  | Rs, Ω | Xs, Ω | Rs, Ω | XS, Ω | Rs, Ω | Xs, Ω | Rs, Ω | Xs, Ω |
| In Air | 1.3 | 10.7 | 1.4 | 10.9 | 1.5 | 11.2 | 1.6 | 11.5 |
| On Metal | 1.4 | 10.0 | 1.5 | 10.3 | 1.6 | 10.6 | 1.7 | 10.9 |
| On Water | 4.9 | 11.3 | 1.8 | 11.1 | 2.4 | 11.7 | 2.9 | 11.5 |
| On Glass | 1.8 | 11.1 | 2.0 | 11.4 | 2.2 | 11.7 | 2.5 | 12.0 |
| On Acrylic | 1.4 | 10.6 | 1.6 | 11.1 | 1.7 | 11.4 | 1.9 | 11.7 |

|  | 900 MHz | | 910 MHz | | 920 MHz | | 930 MHz | |
| --- | --- | --- | --- | --- | --- | --- | --- | --- |
|  | Rs, Ω | Xs, Ω | Rs, Ω | XS, Ω | Rs, Ω | Xs, Ω | Rs, Ω | Xs, Ω |
| In Air | 1.8 | 11.8 | 2.0 | 12.1 | 2.2 | 12.4 | 2.4 | 12.8 |
| On Metal | 1.9 | 11.2 | 2.1 | 11.6 | 2.3 | 12.0 | 2.6 | 12.4 |
| On Water | 2.5 | 12.3 | 3.0 | 12.7 | 5.8 | 14.1 | 9.1 | 13.2 |
| On Glass | 2.8 | 12.4 | 3.2 | 12.8 | 3.7 | 13.2 | 4.2 | 13.6 |
| On Acrylic | 2.0 | 12.1 | 2.3 | 12.4 | 2.5 | 12.8 | 2.8 | 13.2 |

Figure 8:
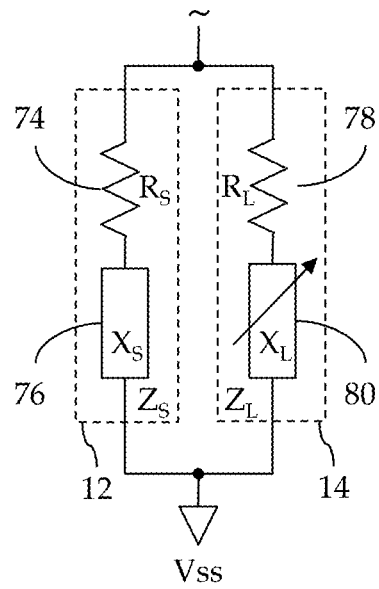
FIG. 8 illustrates, in block schematic form, an alternative representation of the impedance represented by the antenna and the tank circuit of the exemplary RFID receiver circuit.

The tuner circuit 16 of our invention as disclosed in the Related References automatically adjusts the load impendence by adjusting load reactance 80 (see, e.g., FIG. 8) to match source antenna impedance represented by source resistance 74 (see, e.g., FIG. 8) and source reactance 76 (see, e.g., FIG. 8). As previously disclosed, matching of the chip load impedance and antenna source impedance can be performed automatically in order to achieve maximum power transfer between the antenna and the chip. My invention as disclosed in the Related References contained a digital shift register 90 for selectively changing the value of the load reactive component 80 (see, e.g., FIG. 8), in the present case a variable capacitor, until power transfer is maximized. (For reference, digital shift register 90 corresponds to shift register 64 in FIG. 5 of the Parent Patent.) This digital value of the matched impendence may be used either internally by the tag 88, or read and used by the reader 92, to discern relative environmental information to which the tag 88 is exposed. For example, tag 88 may contain a calibrated look-up-table within the clock/control circuit 44 which may be accessed to determine the relevant environmental information. Likewise, a RFID reader 92 may issue commands (see transaction 1 in FIG. 11) to retrieve (see transaction 2 in FIG. 11) the values contained in digital shift register 90 via conventional means, and use that retrieved information to evaluate the environment to which tag 88 is exposed. The evaluation could be as simple as referencing fixed data in memory that has already been stored and calibrated, or as complex as a software application running on the reader or its connected systems for performing interpretive evaluations.

Likewise, consider a tag 88 containing our field strength (i.e., received power) detector 20 (not shown, but, e.g., see FIG. 6) wherein the method of operation of the system containing the tag 88 calls for our field strength detector 20 to selectively perform its sweep function and developing the quantized digital representation of the current via the method discussed earlier. As illustrated in FIG. 11, counter 38 will contain the digital representation developed by our field strength detector 20 of the RF signal induced current, and may be used either internally by the tag 88, or read and used by the reader 92, to discern relative environmental information to which the tag 88 is exposed. For example, reader 92 may issue a command to the tag 88 (see transaction 1 in FIG. 1 1) to activate tuner 16 and/or detector 20 and, subsequent to the respective operations of tuner 16 and/or detector 20, receive (see transaction 2 in FIG. 11) the digital representations of either the matched impedance or the maximum current developed during those operations. Once again, this digital value of the field strength stored in the counter 38 may be used either internally by the tag 88, or read and used by the reader 92, to discern relative environmental information to which the tag 88 is exposed. For example, tag 88 may contain a calibrated look-up-table within the clock and control block 44 which may be accessed to determine the relevant environmental information. Likewise, a RFID reader may issue commands to retrieve the values contained in digital shift register 90, and use that retrieved information to evaluate the environment to which tag 88 is exposed. The evaluation could be as simple as referencing fixed data in memory that has already been stored and calibrated, or as complex as a software application running on the reader or its connected systems for performing interpretive evaluations. Thus, the combining of the technologies enables a user to sense the environment to which a tag 88 is exposed as well as sense changes to that same environment.

As we have explained in the Parent Provisional One, it is well known that changes in some environmental factors will result in respective changes the effective impedance of the antenna 12. In a number of the Related References, we have shown that it is possible to dynamically retune the tank circuit 14 to compensate for the environmentally-induced change in impedance by systematically changing the digital tuning parameters of tank circuit 14, using techniques disclosed, inter alia, in Parent Patent One. We will now show how it is possible to develop an estimate of the relative change in the environmental factor as a function of the relative change in the digital tuning parameters of the tank circuit 14.

Figure 12:
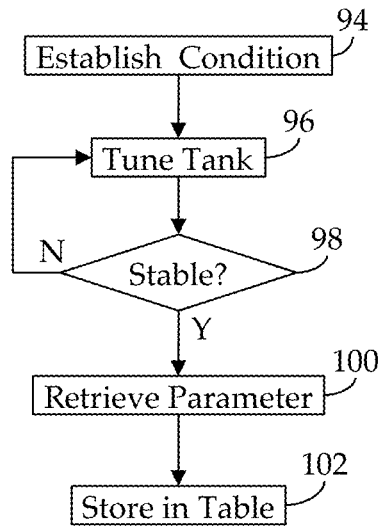
FIG. 12 illustrates, in flow diagram form, the sequencing of the operations in developing a reference table associating tank tuning parameters with system frequency.

As can be seen in Table 1, above, it is possible to develop, a priori, a reference table storing information relating to a plurality of environmental reference conditions. Thereafter, in carefully controlled conditions wherein one and only one environmental condition of interest is varied (see, FIG. 12), an operational tag 88 is exposed to each of the stored reference conditions (step 94) and allowed to complete the tank tuning process. (recursive steps 96 and 98). After tuning has stabilized, the tag 88 can be interrogated (step 100), and the final value in the shift register 90 retrieved (step 100). This value is then stored in the reference table in association with the respective environmental condition (step 102). The resulting table might look like this:

TABLE 2

Tuning Parameters vs. Frequency

|  | 860 MHz | 870 MHz | 880 MHz | 890 MHz | 900 MHz | 910 MHz | 920 MHz | 930 MHz |
| --- | --- | --- | --- | --- | --- | --- | --- | --- |
| In Air | 25 | 21 | 16 | 12 | 8 | 4 | 0 | 0* |
| On Metal | 31 | 27 | 22 | 17 | 12 | 8 | 3 | 0 |
| On Water | 20 | 19 | 12 | 12 | 4 | 0 | 0* | 0* |
| On Glass | 21 | 17 | 12 | 8 | 4 | 0* | 0* | 0* |
| On Acrylic | 23 | 19 | 14 | 10 | 6 | 2 | 0* | 0* |

0* indicates that a lower code was needed but not available; 0 is a valid code.

In contrast to prior art systems in which the antenna impedance must be estimated indirectly, e.g., using the relative strength of the analog signal returned by a prior art tag 88 in response to interrogation by the reader 92, our method employs the on-chip re-tuning capability of our tag 88 to return a digital value which more directly indicates the effective antenna impedance. Using a reference table having a sufficiently fine resolution, it is possible to detect even modest changes in the relevant environmental conditions. It will be readily realized by practitioners in this art that, in general applications, environment conditions typically do not change in an ideal manner, and, more typically, changes in one condition are typically accompanied by changes in at least one other condition. Thus, antenna design will be important depending on the application of interest.

As noted in our Parent Provisional Two, one possible approach would be to mount the antenna 12 on a substrate that tends to amplify the environmental condition of interest, e.g., temperature.

Figure 13B:
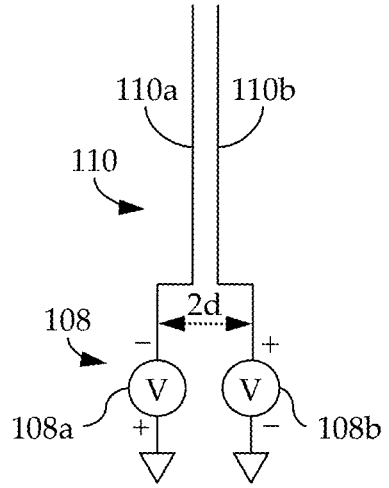
FIGS. 13*a* and 13*b*, illustrate an RF system constructed in accordance with one embodiment of our invention to sense environmental conditions in a selected region surrounding the system.
Figure 13A:
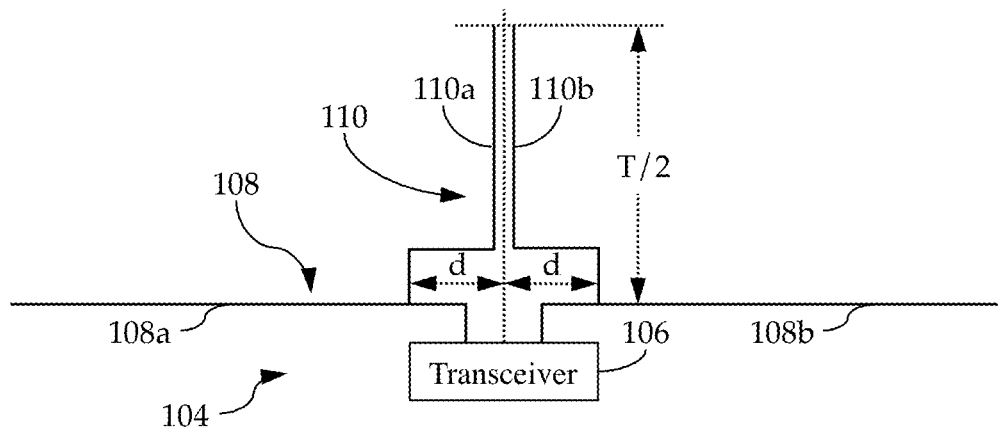

Shown in FIG. 13a is an RF sensing system 104 constructed in accordance with one embodiment of our invention, and specially adapted to facilitate sensing of one or more environmental conditions in a selected region surrounding the system 104. In general, the system 104 comprises: an RF transceiver 106; a di-pole antenna 108 comprising a pole 108a and an anti-pole 108b; and a tail 110 of effective length T, comprising respective transmission line pole 110a and transmission line anti-pole 110b, each of length T I 2. In accordance with our invention, the differential transmission line elements 110a-110b are symmetrically coupled to respective poles 108a-108b at a distance d from the axis of symmetry of the antenna 108 (illustrated as a dotted line extending generally vertically from the transceiver 106). In general, d determines the strength of the interaction between the transmission line 110 and the antenna 108, e.g., increasing d tends to strengthen the interaction. In the equivalent circuit shown in FIG. 13b, the voltage differential between the complementary voltage sources 108a and 108b tends to increase as d is increased, and to decrease as d is decreased. Preferably d is optimized for a given application. However, it will be recognized that the sensitivity of the antenna may be degraded as a function of d if a load, either resistive or capacitive, is imposed on the tail 110.

In operation, the tail 110 uses the transmission line poles 110a-110b to move the impedance at the tip of the tail 110 to the antenna 108, thus directly affecting the impedance of the antenna 108. Preferably, the transceiver 106 incorporates our tuning circuit 16 so as to detect any resulting change in antenna impedance and to quantize that change for recovery, e.g., using the method we have described above with reference to FIG. 12.

Figure 14:
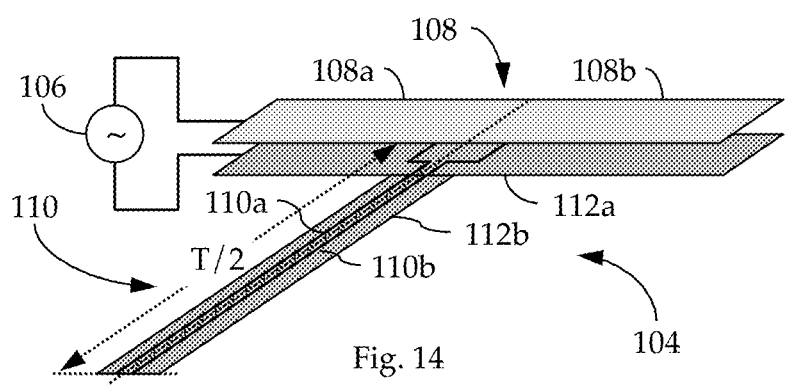
FIG. 14 illustrates, in perspective, exploded view, one possible configuration of an antenna and tail arrangement adapted for use in the system of FIG. 13.

By way of example, we have illustrated in FIG. 14 one possible embodiment of the system 104 in which the antenna poles 108a-108b are instantiated as a patch antenna (illustrated in light grey), with the antenna pole 108a connected to one output of transceiver 106, and the other output of transceiver 106 connected to the antenna antipole 108b. A ground plane 112a (illustrated in a darker shade of grey than the patch antenna 108) is disposed substantially parallel to both the antenna poles 108a-108b and a ground plane 112b disposed substantially parallel to the transmission line poles 110a-110b. As is known, the ground planes 112 are separated from the poles by a dielectric substrate (not shown), e.g., conventional flex material or the like. If the dielectric layer between the antenna poles 108 and ground plane 112a is of a different thickness than the layer between the transmission line poles 110 and the ground plane 112b, the ground plane 112b may be disconnected from the ground plane 112a and allowed to float. In general, this embodiment operates on the same principles as described above with reference to FIG. 13.

Figure 15D:
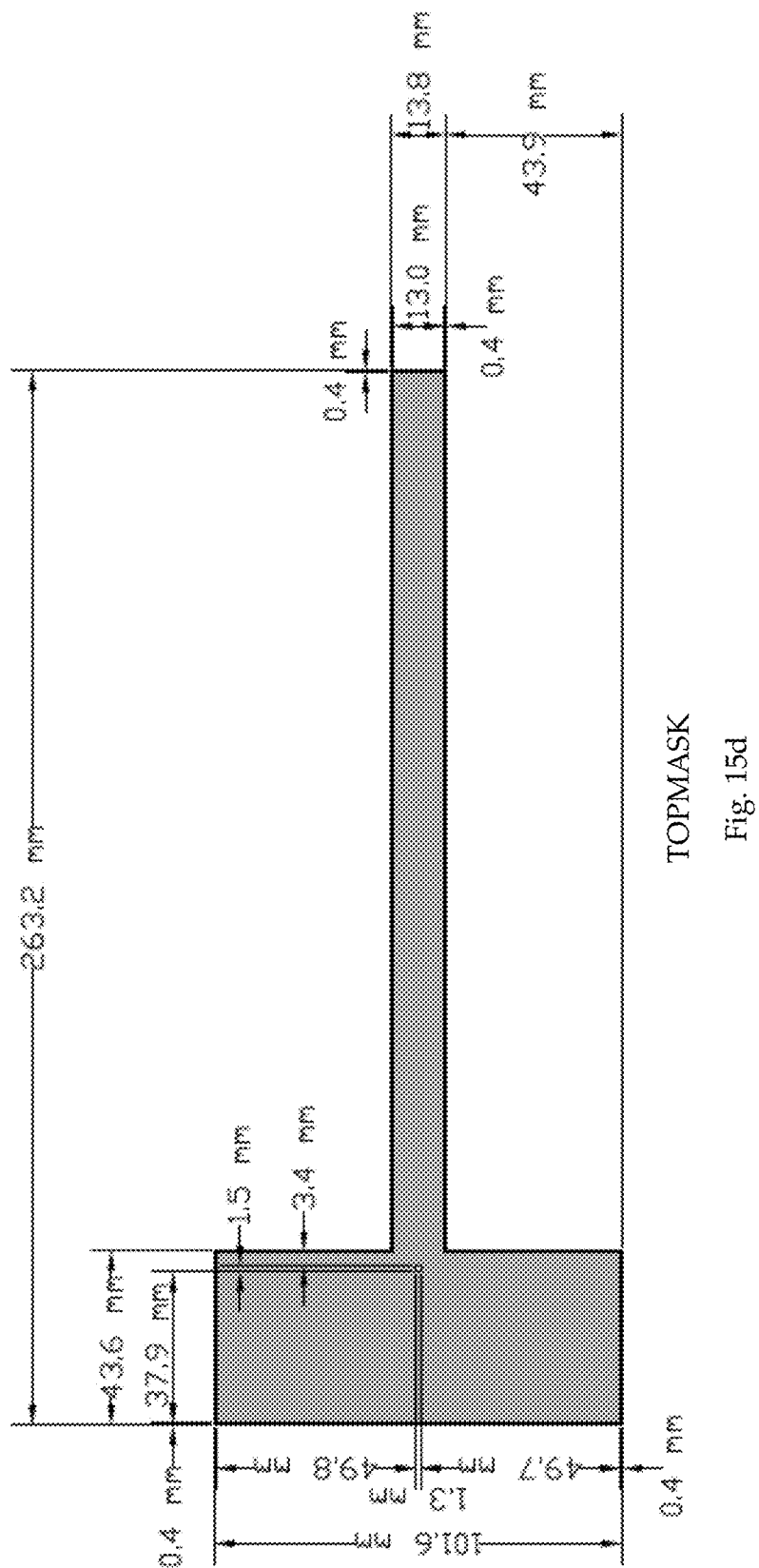
Figure 15E:
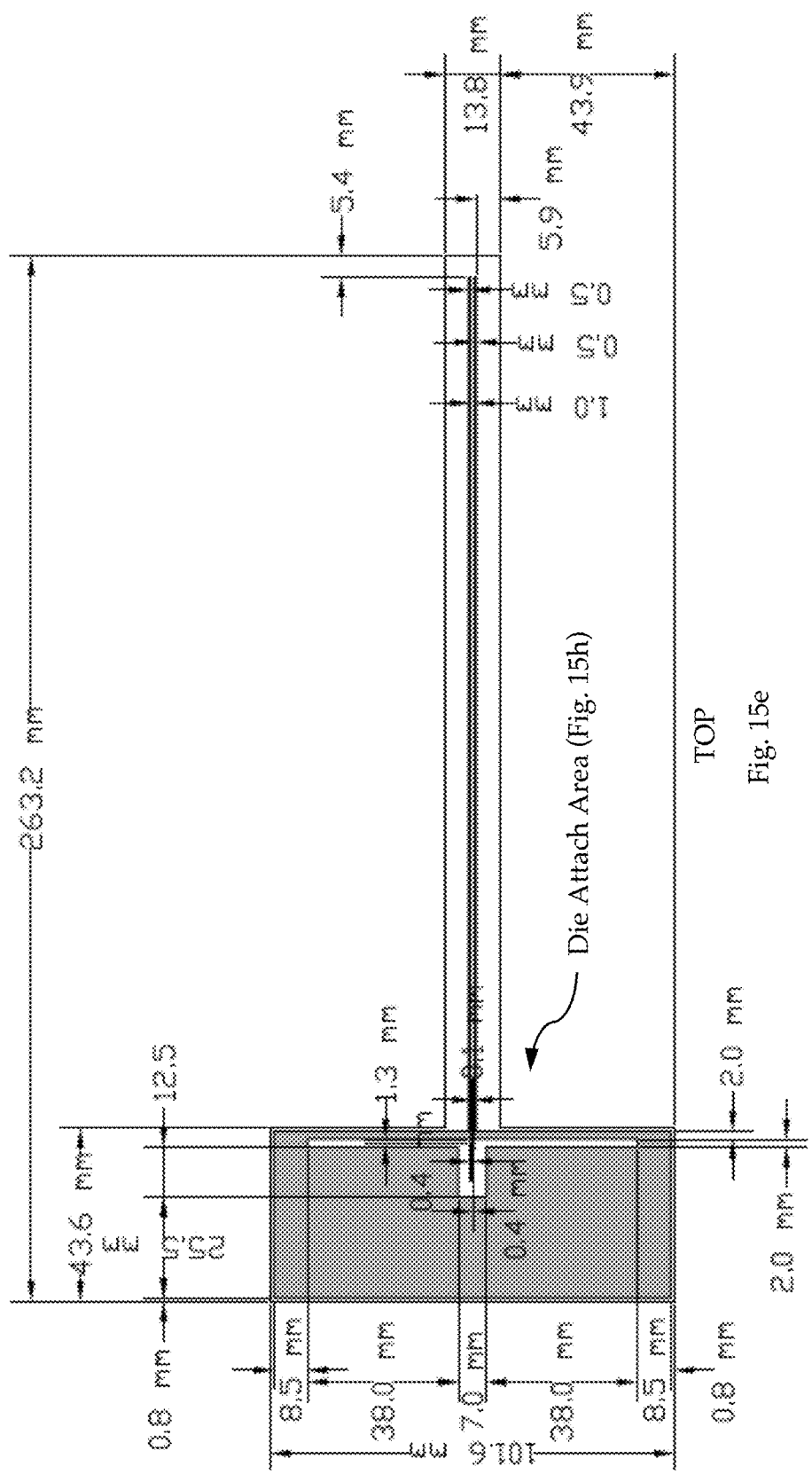
Figure 15F:
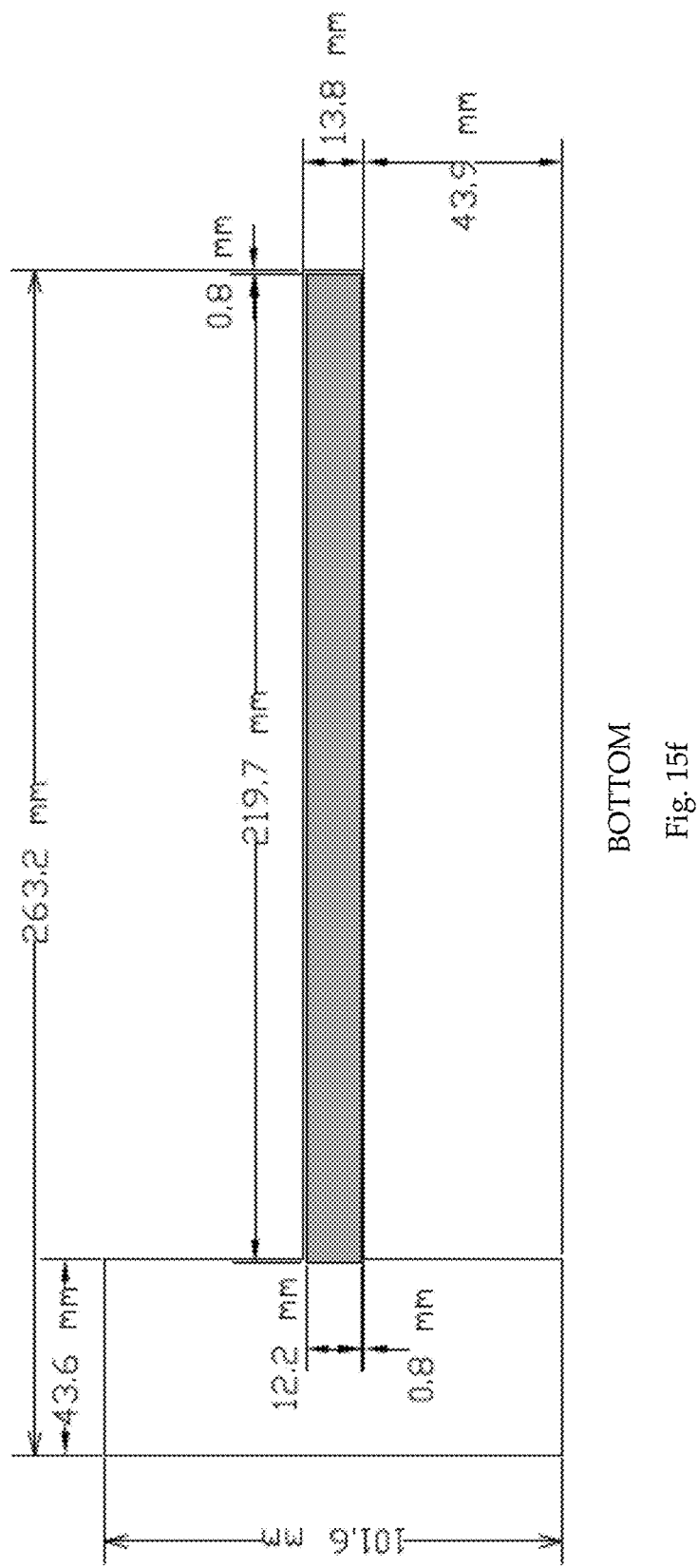

Shown in FIG. 15a is a top plan view of a fully assembled antenna 114 constructed in accordance with one other embodiment of our invention, and specially adapted for use in the sensing system 104 to facilitate sensing the presence of fluids; and, in particular, to the depth of such fluids. In the illustrated embodiment, antenna 114 comprises a head portion 116 and a tail portion 118. In general, the head 116 is adapted to receive RF signals and to transmit responses using conventional backscatter techniques; whereas the tail portion 118 functions as a transmission line. During normal operation, the tail 118 acts to move and transform the impedance at the tip of the tail to the head 116. Accordingly, any change in the tip impedance due to the presence of fluid will automatically induce a concomitant change in the impedance of the head antenna 116. As has been explained above, our tuning circuit 16 will detect that change and re-adjust itself so as to maintain a reactive impedance match. As has been noted above, any such adjustment is reflected in changes in the digital value stored in shift register 90 (FIG. 11). FIG. 15b and FIG. 15c illustrate, in cross-section, the several layers comprising a head and a tail portion, respectively, of the antenna. FIG. 15d through FIG. 15g illustrate, in plan view, the several separate layers of the antenna as shown in FIG. 15b and FIG. 15c. FIG. 15h illustrates, in partial plan view, a close-up depiction of a central, slot portion of the antenna of FIG. 15a (as noted in FIG. 15e) showing in greater detail the construction of antenna elements to which an RFID tag die may be attached.

Figure 16:
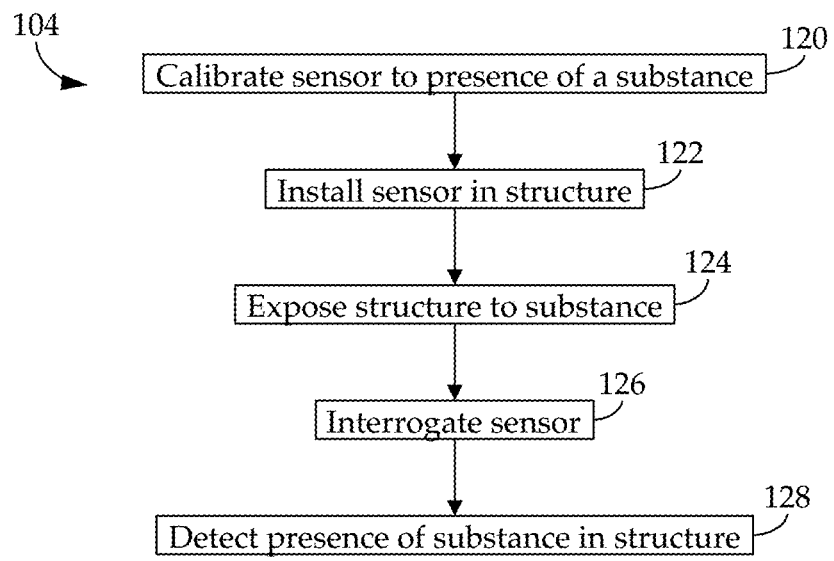
FIG. 16 illustrates, in flow diagram form, the sequencing of the operations in detecting the presence of a contaminant using, e.g., the antenna of FIG. 15 in the system shown in FIG. 11.

Shown in FIG. 16 is one possible flow for a sensing system 104 using the antenna 114. As has been explained above with reference to FIG. 12, the sensor is first calibrated (step 120) to detect the presence of varying levels of a particular substance. For the purposes of this discussion, we mean the term substance to mean any physical material, whether liquid, particulate or solid, that is: detectable by the sensor; and to which the sensor demonstrably responds. By detectable, we mean that, with respect to the resonant frequency of the antenna 114 in the absence of the substance, the presence of the substance in at least some non-trivial amount results in a shift in the resonant frequency of the antenna 114, thereby resulting in a concomitant adjustment in the value stored in the shift register 90; and by demonstrably responds we mean that the value stored in the shift register 90 varies as a function of the level the substance relative to the tip of the tail 118 of the antenna 114. Once calibrated, the sensor can be installed in a structure (step 122), wherein the structure can be open, closed or any condition in between. The structure can then be exposed to the substance (step 124), wherein the means of exposure can be any form appropriate for both the structure and the substance, e.g., sprayed in aerosol, foam or dust form, immersed in whole or in part in a liquid, or other known forms. Following a period of time deemed appropriate for the form of exposure, the sensor is interrogated (step 126) and the then-current value stored in the shift register 90 retrieved. By correlating this value with the table of calibration data gathered in step 120, the presence or absence of the substance can be detected (step 128).

In one embodiment, the table of calibration data can be stored in the sensor and selectively provided to the reader during interrogation to retrieve the current value. Alternatively, the table can be stored in, e.g., the reader and selectively accessed once the current value has been retrieved. As will be clear, other embodiments are possible, including storing the table in a separate computing facility adapted to selectively perform the detection lookup when a new current value has been retrieved.

Assume by way of example, an automobile assembly line that includes as an essential step the exposure, at least in part, of a partially-assembled automobile chassis to strong streams of a fluid, e.g., water, so as to determine the fluid-tightness of the chassis. Given the complexity of a modern automobile, it is not cost effective to manually ascertain the intrusion of the fluid at even a relatively small number of possible points of leakage. However, using our sensors and sensing system 104, we submit that it is now possible to install relatively large numbers of independently operable sensors during the assembly process, even in highly inaccessible locations such as largely-enclosed wiring channels and the like. In the course of such installations, the unique identity codes assigned to each installed sensor is recorded together with pertinent installation location details. After extraction from the immersion tank, the chassis can be moved along a conventional conveyor path past an RFID reader sited in a position selected to facilitate effective querying of all of the installed sensors. In one embodiment, the reader may be placed above the moving chassis so as to "look down" through the opening provided for the front windshield (which may or may not be installed) into the interior portion of the chassis; from such a position even those sensors installed in the "nooks and crannies" in the trunk cavity should be readable. By correlating the code read from each sensor with the previously constructed, corresponding table, it is now possible to detect the presence (or absence) of the substance at the respective location of that sensor; indeed, if the sensor is sufficiently sensitive to the substance, it may be possible to estimate the severity of the leakage in the vicinity of each sensor.

Figure 17:
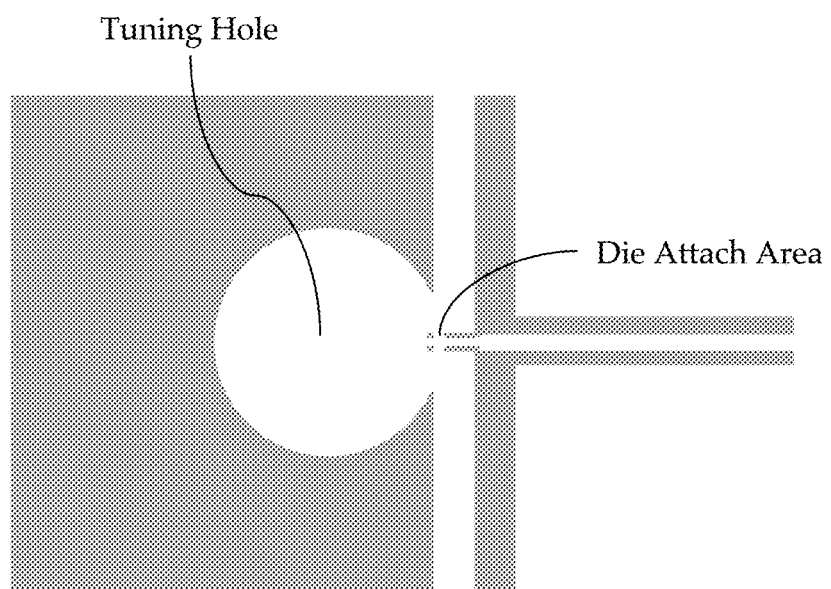
FIG. 17, comprising

Shown in FIG. 17 is an antenna 130 constructed in accordance with one other embodiment of our invention, and specially adapted for use in the sensing system 104 to facilitate sensing the presence of fluids; and, in particular, to the depth of such fluids. As illustrated in FIG. 17a, the top layer of antenna 132 comprises: a patch antenna portion 134; an antenna ground plane 136; a tail portion 138; and a die attach area 140. As noted in FIG. 17a, the tail portion 138 of antenna 130 comprises a pair of generally parallel transmission lines 142, each substantially the same in length. As illustrated in FIG. 17b, the bottom layer of antenna 130 comprises a ground plane 136 for the transmission lines 142. During a typical assembly process, the illustrated shapes are formed in the top and bottom layers of a continuous roll of copper-dad flex circuit material, and each antenna 130 cut from the roll using a rolling cutter assembly. An RFID tag device (incorporating our tuning circuit 16) is then attached to the die attach area 140, and the antenna 130 is folded along fold lines 1 and 2 generally around a suitable core material such as PET or either open-cell or closed-cell foam.

In general, the patch antenna portion 134 is adapted to receive RF signals and to transmit responses using conventional backscatter techniques. During normal operation, the transmission lines 142 comprising the tail 138 act to move and transform the impedance at the tip of the tail 138 to the patch antenna 134. Accordingly, any change in the tip impedance due to the presence of fluid will automatically induce a concomitant change in the impedance of the head antenna. As has been explained above, our tuning circuit 16 will detect that change and re-adjust itself so as to maintain a reactive impedance match. As has been noted above, any such adjustment is reflected in changes in the digital value stored in shift register 90 (FIG. 11).

Thus it is apparent that we have provided an effective and efficient method and apparatus for sensing changes to an environment to which the RFID tag is exposed. Those skilled in the art will recognize that modifications and variations can be made without departing from the spirit of our invention. Therefore, we intend that our invention encompass all such variations and modifications as fall within the scope of the appended claims.

What is claimed is:

1. A radio frequency (RF) circuit comprises:
   a tank circuit having a selectively variable impedance;
   a tuning circuit adapted to dynamically vary the impedance of the tank circuit, and to develop a first quantized value representative of a change to impedance of the tank circuit; and
   a detector circuit adapted to develop a second quantized value representative of a field strength of a received RF signal, wherein the detector circuit includes:
      a current reference circuit operable to generate a reference current corresponding to a shunted current of a supply voltage regulator;
      a controlled current source; and
      a control circuit operable to adjust the controlled current source to produce a current that substantially mirrors the reference current, wherein the control circuit generates the second quantized value as a function of the adjusting the controlled current source.

2. The RF circuit of claim 1, wherein the tank circuit comprises:
   an inductor; and
   a variable capacitor coupled to the inductor, wherein the tuning circuit adjusts capacitance of the variable capacitor such that a resonant frequency of the tank circuit substantially matches a frequency of the received RF signal.

3. The RF circuit of claim 1, wherein the tuning circuit comprises:
   a voltage reference circuit operable to generate a reference voltage that corresponds to a voltage of the tank circuit;
   a differentiator operable to:
      store, for a current time pulse of a plurality of time pulses, a current value of the reference voltage; and
      determine, for the current pulse, a relationship between the current value of the reference voltage and a previous value of the reference voltage;
   a selection circuit operable to generate, for the current pulse, an up-signal or a down-signal based on the relationship; and
   a ramp generator operable to generate a digital change signal based on the up-signal or the down-signal to dynamically vary the impedance of the tank circuit, wherein the digital change signal corresponds to the first quantized value.

4. The RF circuit of claim 3, wherein the tuning circuit comprises:
   the differentiator determining a first relationship when the current value of the reference voltage is greater than the previous value of the reference voltage and determining a second relationship when the current value of the reference voltage is less than the previous value of the reference voltage;

the selection circuit generating the up-signal for the first relationship and generating the down-signal for the second relationship; and the ramp generator generating the digital change signal to increase impedance of the tank circuit in response to the up-signal and generating the digital change signal to decrease impedance of the tank circuit in response to the down-signal.

5. The RF circuit of claim 3, wherein the tuning circuit further comprises:

a multiplexor operable, in a first state, to provide the relationship to the selection circuit and, in a second state, to provide a representation of the second quantized value to the selection circuit.

6. The RF circuit of claim 1, wherein the current reference circuit comprises one of:

a diode connected reference transistor;

a Widlar current source; and a resistor.

7. The RF circuit of claim 1, wherein the controlled current source comprises one of:

a plurality of selectable current sources; and a resistor.

8. The RF circuit of claim 1, wherein the control circuit comprises:

an analog to digital converter (ADC) operable to convert an analog voltage corresponding to the reference current into a digital capture value;

a latch operable to, in response to a control signal, store a current version of the digital value;

a clock & control circuit operable to generate the control signal and to generate a counter control signal based on the digital capture value; and a counter operable to generate a digital adjust value based on the counter control signal, wherein the digital adjust value adjusts the controlled current source and corresponds to the second quantized value.

9. The RF circuit of claim 1 further comprises:

a transmitter operable to transmit at least one of the first and second quantized values to a radio frequency identification (RFID) reader.

10. The RF circuit of claim 1 further comprises:

a receiver operable to receive a command from a radio frequency identification (RFID) reader.

* * * * *